US008705907B2

(12) United States Patent
Wang et al.

(10) Patent No.: US 8,705,907 B2
(45) Date of Patent: Apr. 22, 2014

(54) OPTICAL INTERCONNECT DEVICE AND METHOD FOR MANUFACTURING THE SAME

(75) Inventors: Dongdong Wang, Rancho Palos Verdes, CA (US); Zhenhua Shao, Alhambra, CA (US); Xu Huang, Torrance, CA (US); Masataka Ito, Torrance, CA (US); Christopher Lee Keller, Torrance, CA (US)

(73) Assignee: Ibiden Co., Ltd., Ogaki-shi (JP)

( * ) Notice: Subject to any disclaimer, the term of this patent is extended or adjusted under 35 U.S.C. 154(b) by 147 days.

(21) Appl. No.: 13/038,421

(22) Filed: Mar. 2, 2011

(65) Prior Publication Data

US 2011/0206316 A1    Aug. 25, 2011

Related U.S. Application Data

(63) Continuation of application No. 11/857,695, filed on Sep. 19, 2007, now Pat. No. 8,107,776.

(60) Provisional application No. 60/845,501, filed on Sep. 19, 2006, provisional application No. 60/853,421, filed on Oct. 23, 2006, provisional application No. 60/867,716, filed on Nov. 29, 2006.

(51) Int. Cl.
*G02B 6/10* (2006.01)
*H04B 10/00* (2013.01)

(52) U.S. Cl.
USPC .............................. 385/14; 398/141

(58) Field of Classification Search
USPC ....................................... 398/141
See application file for complete search history.

(56) References Cited

U.S. PATENT DOCUMENTS

| 5,357,363 A | 10/1994 | Li et al. |
|---|---|---|
| 6,337,886 B1 | 1/2002 | Asahi |
| 6,404,960 B1 | 6/2002 | Hibbs-Brenner et al. |
| 6,498,358 B1 | 12/2002 | Lach et al. |

(Continued)

FOREIGN PATENT DOCUMENTS

| JP | 08-036122 | 2/1996 |
|---|---|---|
| JP | 10-135407 | 5/1998 |

(Continued)

OTHER PUBLICATIONS

Korean Office Action issued on Dec. 17, 2010 in Korean Application Serial No. 2009-7003530.

(Continued)

*Primary Examiner* — Jerry Rahll
(74) *Attorney, Agent, or Firm* — Oblon, Spivak, McClelland, Maier & Neustadt, L.L.P.

(57) ABSTRACT

An optical interconnect device includes a first substrate, a second substrate, an optical waveguide, an electrical wiring and a switching device. The first substrate has an electrical wiring circuit, an electrical-optical converter for converting an electrical signal to an optical signal, and a light emitting device for emitting a light. The second substrate has an electrical wiring circuit, an optical-electrical converter for converting the optical signal to the electrical signal, and a light receiving device for receiving the light from the light emitted device. The optical waveguide optically connects the light emitting and light receiving devices. The electrical wiring electrically connects the electrical wiring circuits of the first and second substrates. The switching device determines a fast signal of data to be transmitted via the optical substrate and a slow signal of data to be transmitted via the electrical wiring.

27 Claims, 43 Drawing Sheets

(56) References Cited

U.S. PATENT DOCUMENTS

| | | |
|---|---|---|
| 6,611,635 B1 | 8/2003 | Yoshimura et al. |
| 6,722,792 B2 | 4/2004 | Raj et al. |
| 6,826,213 B1 | 11/2004 | Edwards et al. |
| 6,952,504 B2 | 10/2005 | Bi et al. |
| 7,130,511 B2 | 10/2006 | Riester et al. |
| 2002/0172453 A1 | 11/2002 | Carberry et al. |
| 2005/0201693 A1 | 9/2005 | Korenaga et al. |
| 2006/0023991 A1 | 2/2006 | Okubora |
| 2006/0067608 A1 | 3/2006 | Kobayashi et al. |
| 2006/0269288 A1 | 11/2006 | Guidotti et al. |
| 2007/0206908 A1 | 9/2007 | Cohen et al. |
| 2010/0195967 A1 | 8/2010 | Wang et al. |
| 2011/0014733 A1 | 1/2011 | Wang et al. |

FOREIGN PATENT DOCUMENTS

| | | |
|---|---|---|
| JP | 2002-6161 | 1/2002 |
| JP | 2006-33804 | 2/2006 |
| KR | 10-2004-0036626 | 4/2004 |
| KR | 10-0570424 | 4/2006 |

OTHER PUBLICATIONS

United States Office Action issued on Dec. 29, 2010, U.S. Appl. No. 12/890,147, filed Sep. 24, 2010.

U.S. Appl. No. 13/012,252, filed Jan. 24, 2011, Shao et al.

Daniel Guidotti et al., "Edge Viewing Photodetectors for Strictly In-plane Lightwave Circuit Integration and Flexible Optical Interconnects", Electronic Components and Technology Conference, 2006, pp. 782-788.

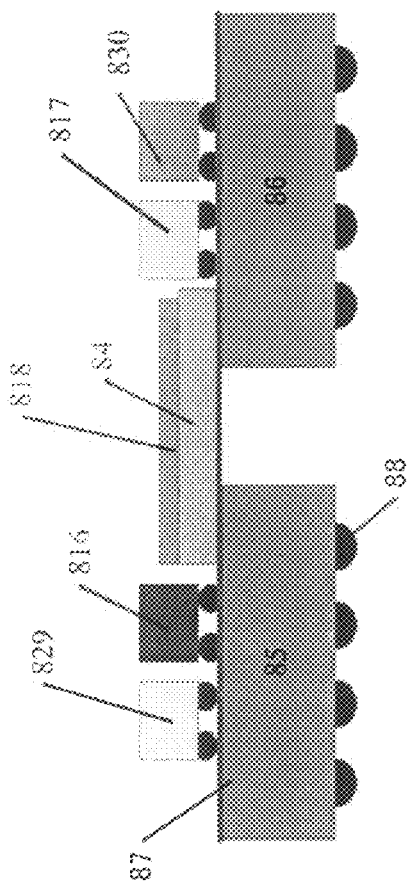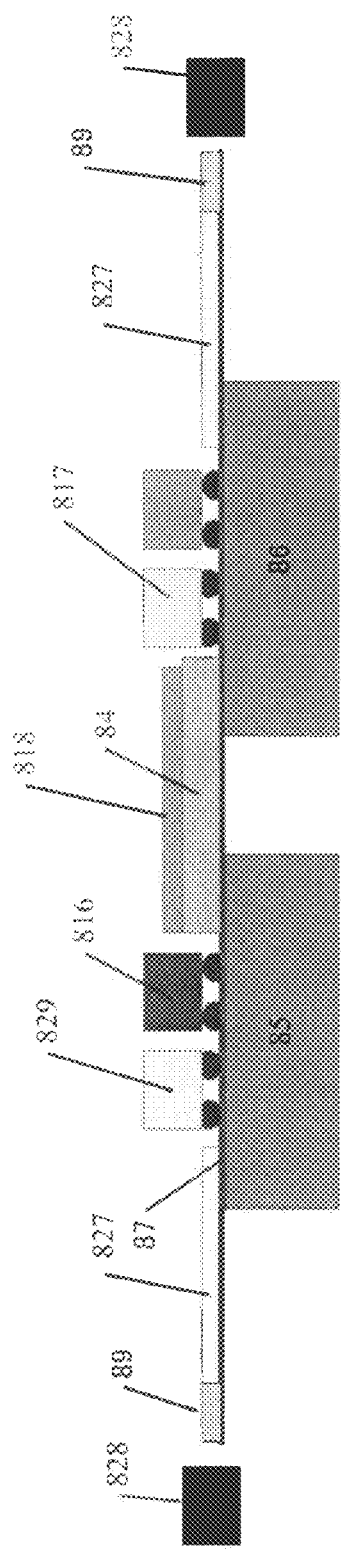

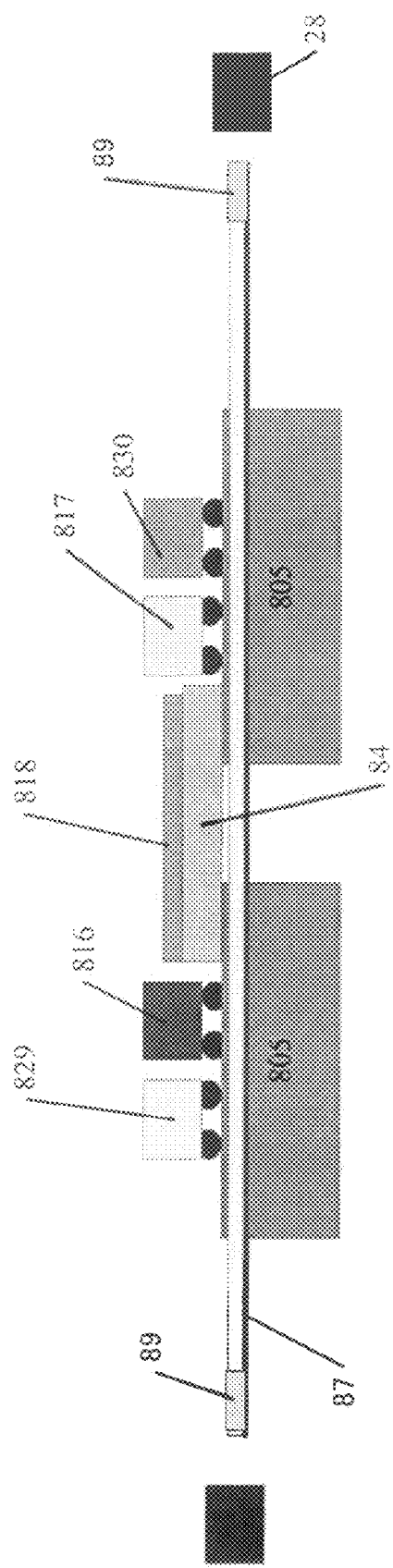

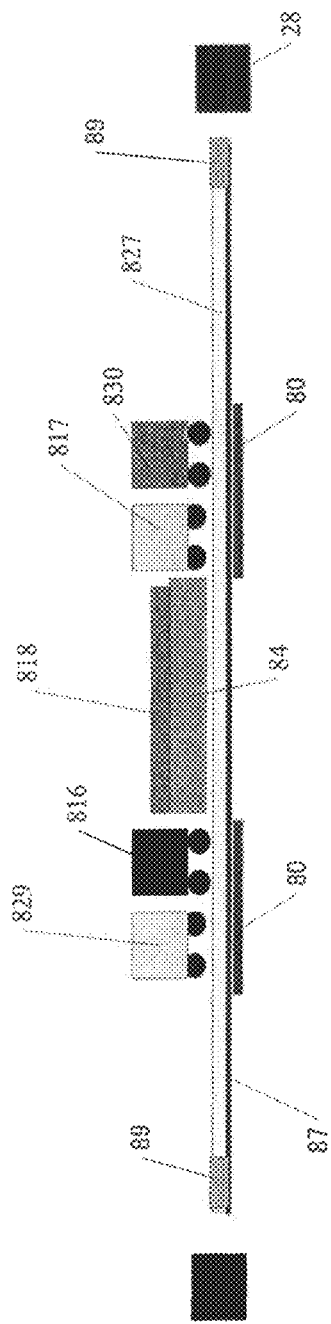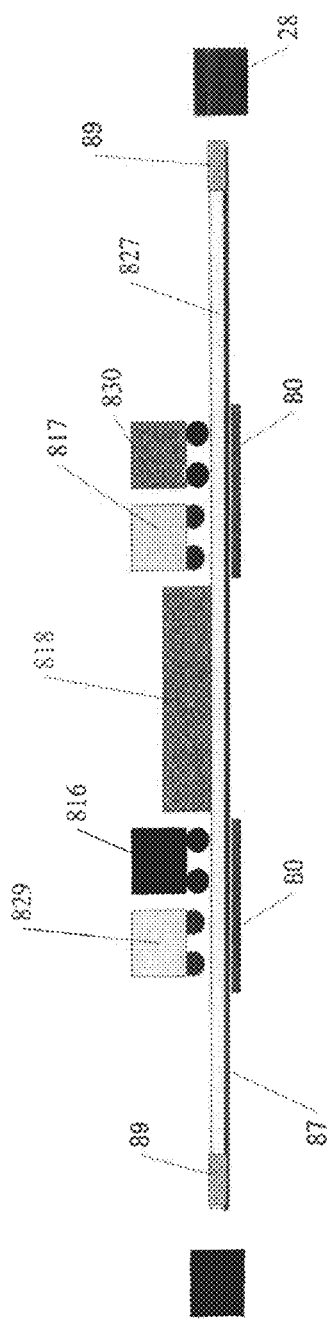

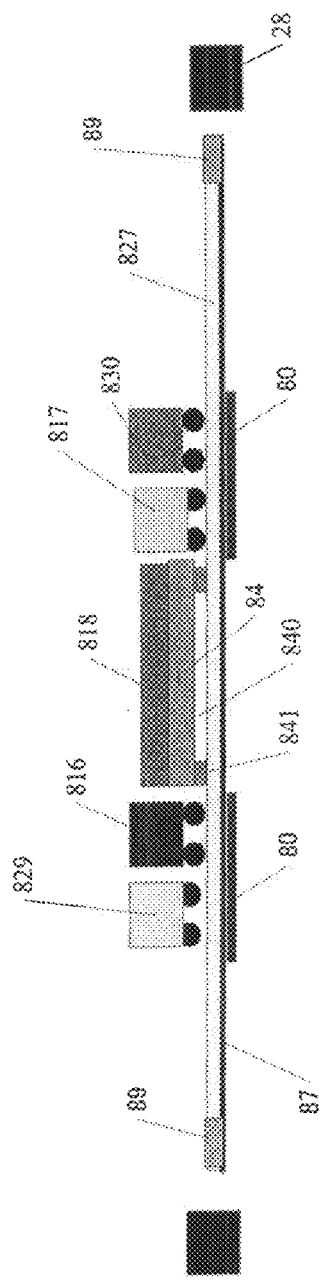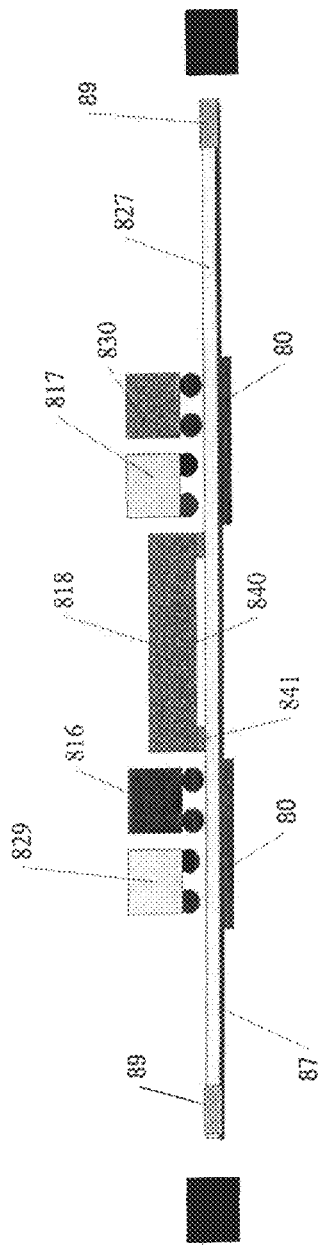

Cross-Sectional View

Cross-Sectional View

Cross-Sectional View

Fig. 7(d)
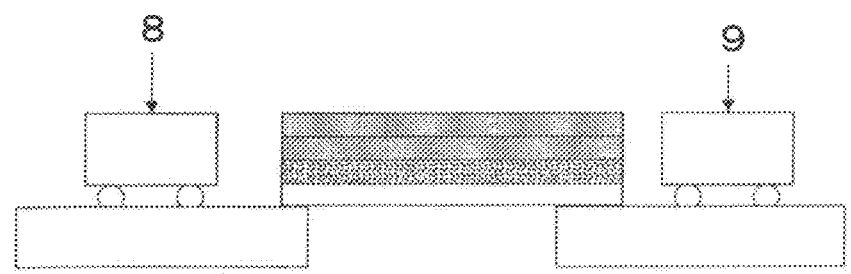
Cross-Sectional View
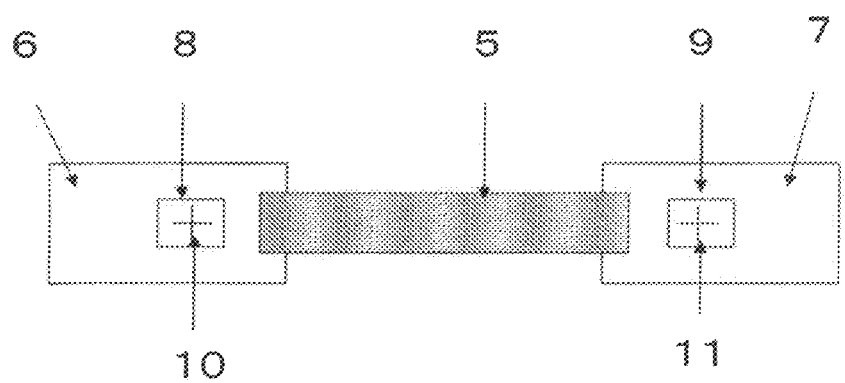
Top Surface View

Fig. 7(e)
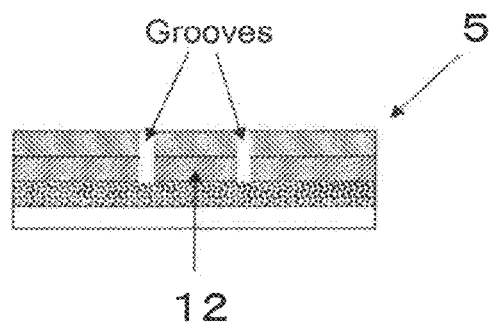
Cross-Sectional View of Substrate 5 seen
from the Optical Component side
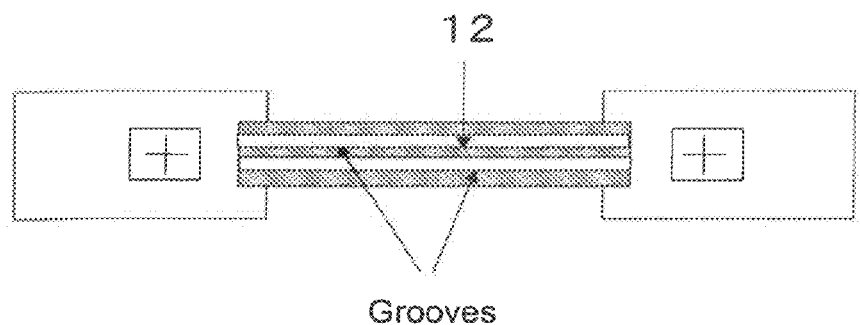
Top Surface View
Grooves: Grooves formed by removing the Upper
Clad Layer and Core Layer using a CO2 Laser Cross-Sectional View Cross-Sectional View Cross-Sectional View

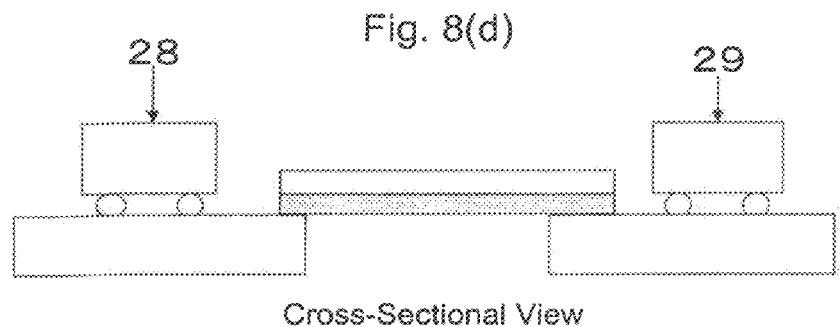
Fig. 8(d)
Cross-Sectional View
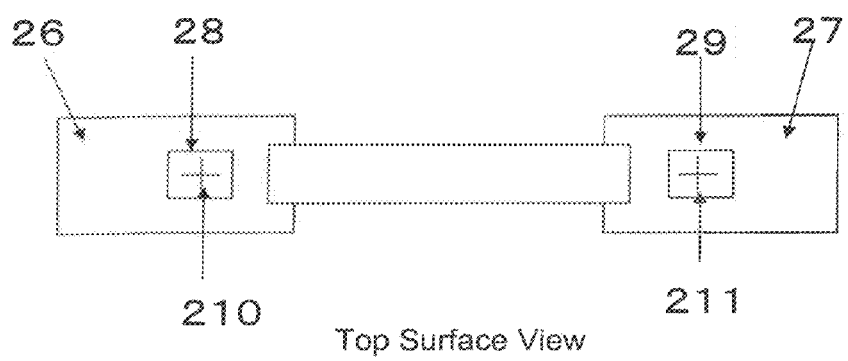
Top Surface View
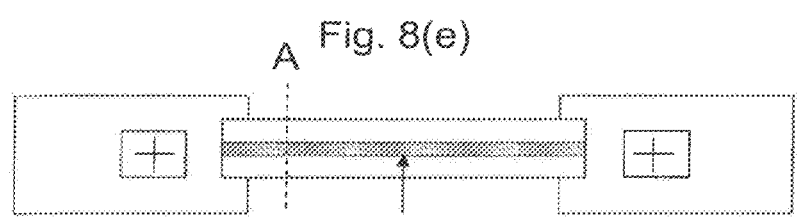
Fig. 8(e)
Top Surface View
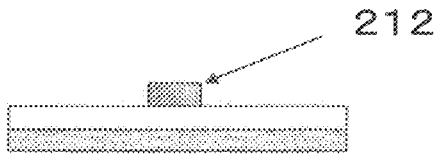
Cross-Sectional View at A-A Section of the above illustration Top Surface View Cross-Sectional View at B-B Section of the above illustration Cross-Sectional View Cross-Sectional View Cross-Sectional View Cross-Sectional View Fig. 9(e)
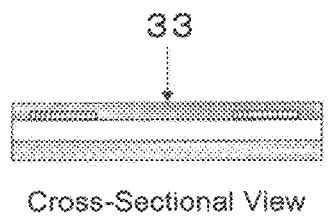
Cross-Sectional View
Fig. 9(f)
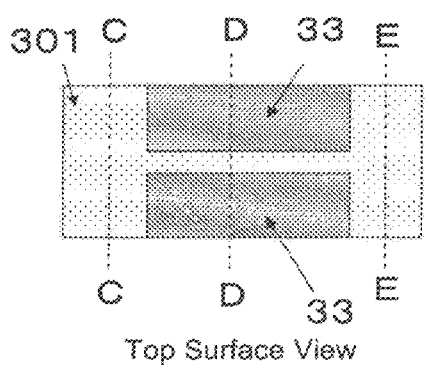
Top Surface View
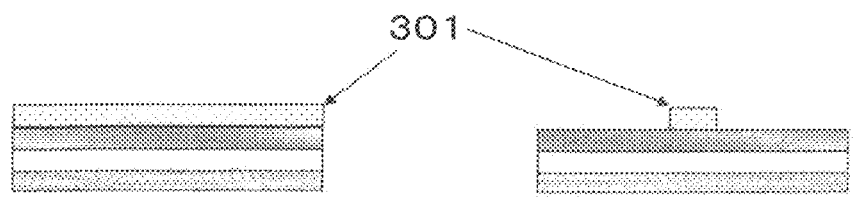
Cross-Sectional View at C-C Section and  Cross-Sectional View at D-D Section
E-E Section on the above illustration      on the above illustration Top Surface View Cross-Sectional View at F-F- Section and H-H Section on the above illustration Cross-Sectional View at G-G Section on the above illustration

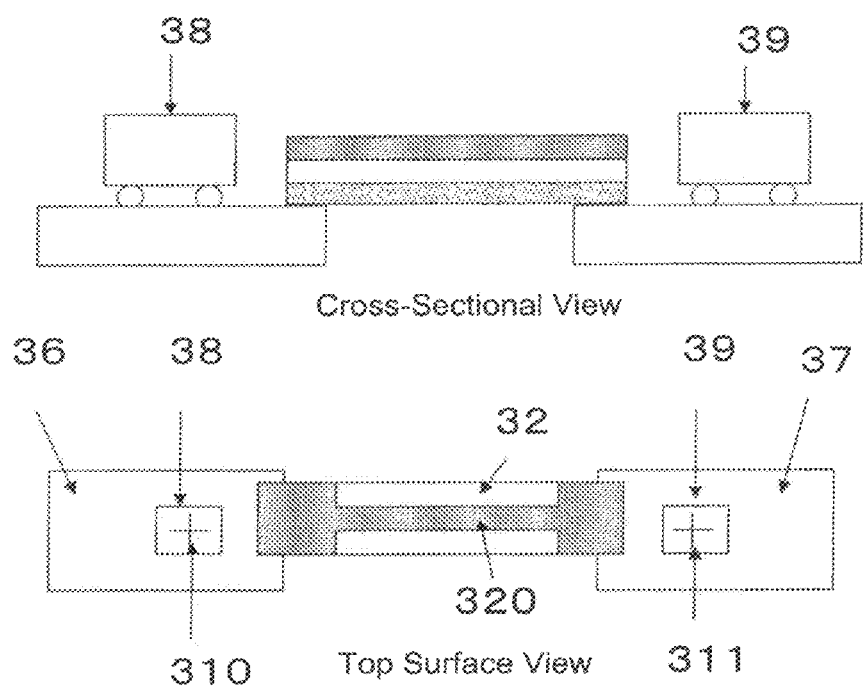

Fig. 9(j)
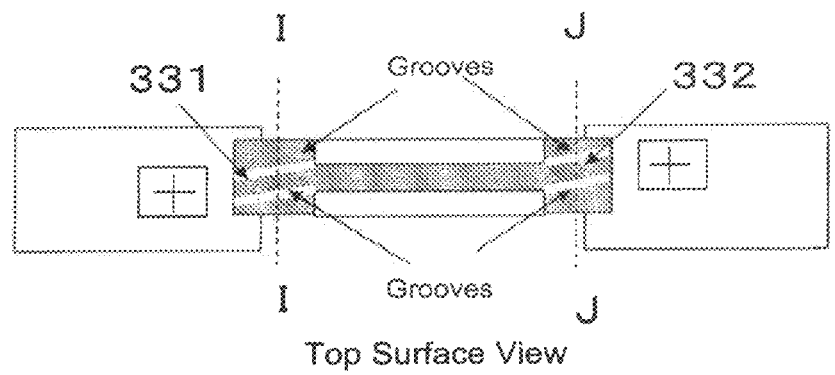
Top Surface View
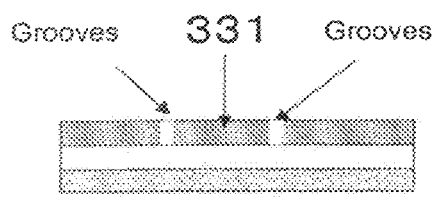
Cross-Sectional View at I-I
Section on the above illustration
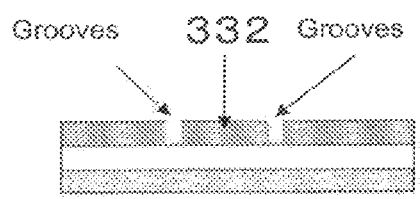
Cross-Sectional View at J-J
Section on the above illustration
Grooves: Grooves formed by removing sections
of the Core Layer using a CO2 Laser
Fig. 9(k)
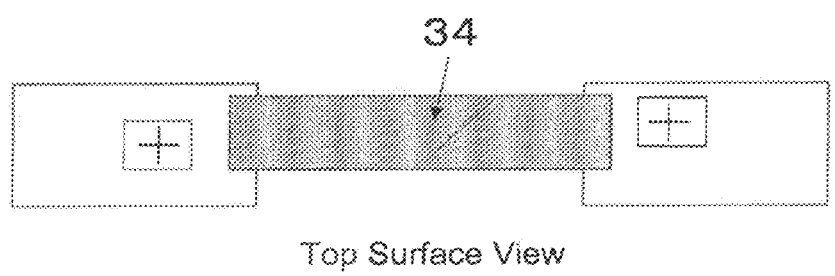
Top Surface View Top Surface View

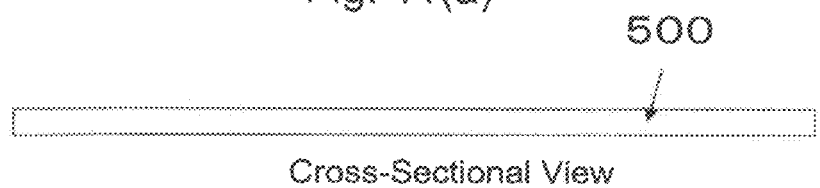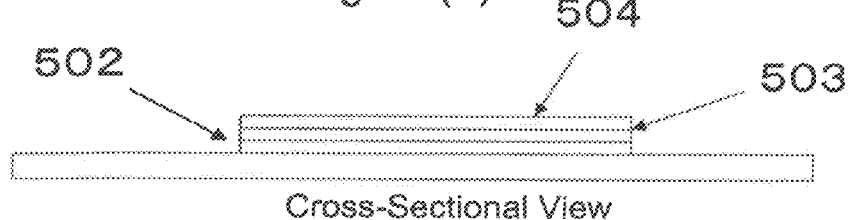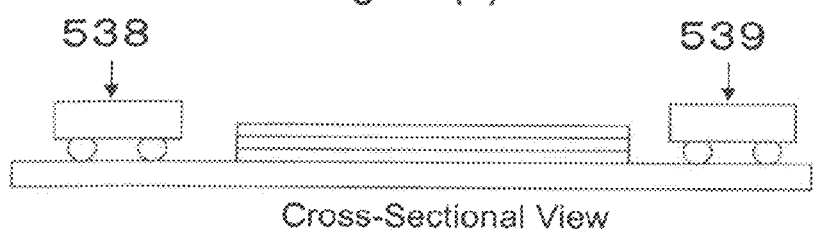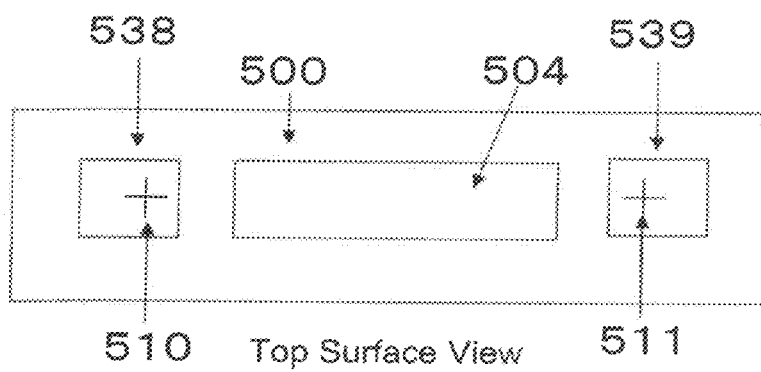

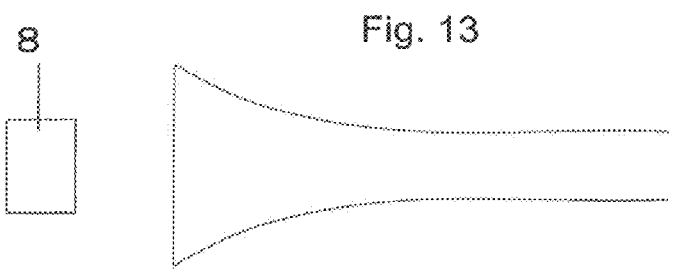
Fig. 13
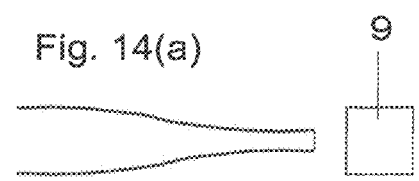
Fig. 14(a)
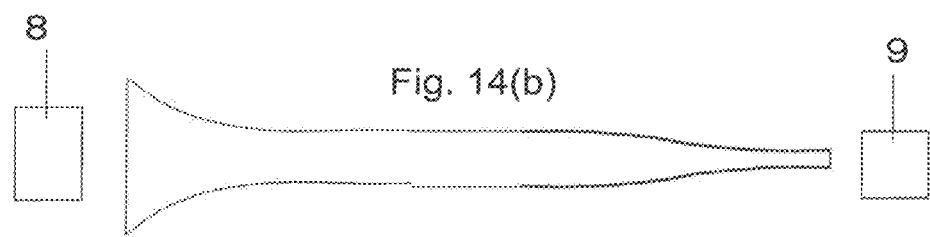
Fig. 14(b)
Fig. 15
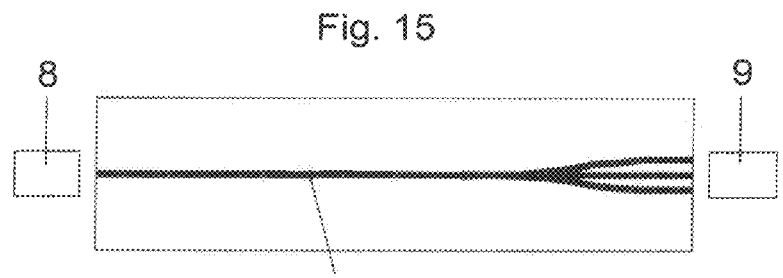
Three-Dimensional Optical Waveguide First Substrate or Second Substrate Cross-Sectional View Cross-Sectional View Cross-Sectional View Top Surface View Top Surface View

OPTICAL INTERCONNECT DEVICE AND METHOD FOR MANUFACTURING THE SAME

CROSS-REFERENCE TO RELATED APPLICATIONS

This application is a continuation of U.S. application Ser. No. 11/857,695, filed Sep. 19, 2007 which is based upon and claims the benefits of priority to U.S. Applications Nos. 60/845,501, filed Sep. 19, 2006, 60/853,421, filed Oct. 23, 2006, and 60/867,716, filed Nov. 29, 2006. The contents of those applications are incorporated herein by reference in their entirety.

BACKGROUND OF THE INVENTION

1. Field of the Invention

The present invention relates to an optical interconnect device and a method for manufacturing the optical interconnect device. The present invention also relates to a method for forming an optical interconnection between an optical component and an optical waveguide.

2. Discussion of the Background

Japanese Patent Laid-Open Publication Hei 8-36122 describes a method for mechanically aligning an optical component and an optical waveguide to reduce a connection loss between the optical component and the optical waveguide. Japanese Patent Laid-Open Publication Hei 10-135407 describes a system for changing means for transmitting signals between a semiconductor integrated circuit apparatus and an external apparatus connected to the semiconductor integrated circuit apparatus, where data signals are transmitted optically and power source and drive signals are transmitted electrically. The contents of these references are incorporated herein by reference in their entirety.

SUMMARY OF THE INVENTION

According to one aspect of the present invention, an optical interconnect device includes a first substrate, a second substrate, an optical waveguide, an electrical wiring and a switching device. The first substrate has an electrical wiring circuit, an electrical-optical converter which is connected to the electrical wiring circuit and converts an electrical signal to an optical signal, and a light emitting device which is connected to the electrical-optical converter and emits a light. The second substrate has an electrical wiring circuit, an optical-electrical converter which is connected to the electrical wiring circuit of the second substrate and converts the optical signal to the electrical signal, and a light receiving device which is connected to the optical-electrical converter and receives the light from the light emitted device. The optical waveguide optically connects the light emitting device and the light receiving device. The electrical wiring electrically connects the electrical wiring circuit of the first substrate and the electrical wiring circuit of the second substrate. The switching device determines a fast signal of data to be transmitted via the optical substrate and a slow signal of data to be transmitted via the electrical wiring.

According to another aspect of the present invention, an optical interconnect device includes a substrate, an optical waveguide and an electrical wiring and a switching device. The substrate has a first electrical wiring portion and a second electrical wiring portion. The first electrical wiring portion includes an electrical-optical converter which converts an electrical signal to an optical signal and a light emitting device which is connected to the electrical-optical converter and emits a light. The second electrical wiring portion includes an optical-electrical converter which converts the optical signal to the electrical signal and a light receiving device which is connected to the optical-electrical converter and receives the light from the light emitted device. The optical substrate optically connects the light emitting device of the first electrical wiring portion and the light receiving device of the second electrical wiring portion. The electrical wiring electrically connects the first electrical wiring portion and the second electrical wiring portion. The switching device determines a fast signal of data to be transmitted via the optical substrate and a slow signal of data to be transmitted via the electrical wiring.

According to yet another aspect of the present invention, a method for forming an optical waveguide includes providing a light emitting device configured to emit a light and a light receiving device configured to receive the light on an electrical wiring substrate, providing an alignment mark for a position of a light emitting point of the light emitting device and an alignment for a position of a light receiving point of the light receiving device, mounting the light emitting device and the light receiving device over a substrate, and forming a 3-dimensional optical waveguide optically connecting the light emitting device and the light receiving device in accordance with the alignment marks.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a side view illustrating a structure of an optical interconnect device;

FIG. 2 is a side view illustrating an optical interconnect device according to another embodiment of the present invention;

FIG. 3 is a side view illustrating an optical interconnect device according to another embodiment of the present invention;

FIGS. 4(a) to 4(e) are side views showing exemplary structures of optical interconnect devices according to embodiments of the present invention;

FIGS. 7(a) to 7(e) are cross-sectional and top views illustrating a method for manufacturing an optical interconnect device according to an embodiment of the present invention, including a starting step, a view after a 2D optical substrate has been formed on the substrate shown in FIG. 7(a), a view after the 2D optical substrate shown in FIG. 1(b) has been fixed on substrates, views after optical components have been mounted on the substrates shown in FIG. 7(c), views after a 3D optical waveguide has been formed;

FIGS. 8(a) to 8(f) are cross-sectional and top views illustrating a method for manufacturing an optical interconnect device according to an embodiment of the present invention, including a starting step, a view after a lower clad layer has been formed on the substrate shown in FIG. 8(a), a view after the substrate shown in FIG. 8(b) has been fixed on other substrates, views after optical components have been mounted on the substrates shown in FIG. 8(c), views after a 3D optical waveguide has been formed, and views after an upper clad layer has been formed on the substrate surface shown in FIG. 8(e);

FIGS. 9(a) to 9(k) are cross-sectional and top views illustrating a method for manufacturing an optical interconnect device according to an embodiment of the present invention, including illustrates a starting step, a view after a lower clad layer has been formed on the substrate shown in FIG. 9(a), a view after a metal layer has been formed on the lower clad layer shown in FIG. 9(b), a view after the optical waveguide alignment marks have been formed on the lower clad layer shown in FIG. 9(b), a view after a core layer has been formed on the substrate shown in FIG. 9(d), views after a mask has been formed on the core layer shown in FIG. 9(e), views after the core except the portion beneath the mask shown in FIG. 9(f) has been removed using the mask, and then the mask has been peeled away, a view after the substrate shown in FIG. 9(g) has been fixed on other substrates, views after optical components have been mounted on the substrates shown in FIG. 9(h), views after a 3D core has been formed, a view after an upper clad layer has been formed on the substrate shown in FIG. 9(j), and views after a mask has been formed on a core layer;

FIGS. 11(a) to 11(c) are cross-sectional and top views illustrating a method for manufacturing an optical interconnect device according to an embodiment of the present invention, including a starting step, a view after a 2D optical substrate has been formed on the substrate shown in FIG. 11 (a), and views after optical components have been mounted on the substrate shown in FIG. 11 (b).

FIG. 13 includes a top view illustrating a 3D optical waveguide facing a laser diode;

FIGS. 14(a) and 14(b) are top views illustrating a 3D optical waveguide facing a photo diode and a 3D optical waveguide facing a laser diode and a photo diode;

FIG. 15 is a top view illustrating an example of a 3D optical waveguide;

DESCRIPTION OF THE EMBODIMENTS

Figure 4E:
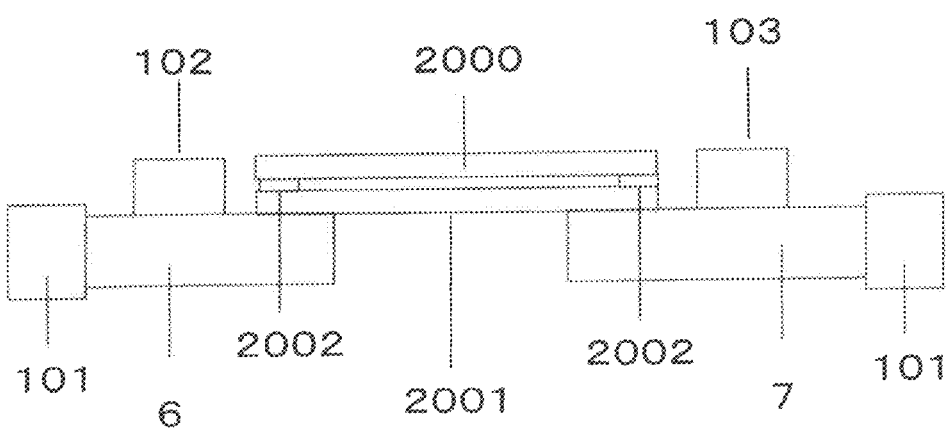

The embodiments will now be described with reference to the accompanying drawings, wherein like reference numerals designate corresponding or identical elements throughout the various drawings.

FIG. 1 is a side view illustrating an optical interconnect device according to an embodiment of the present invention. On first rigid substrate 85 (may also be referred to as "first electrical wiring substrate"), laser diode 816 and its drive circuit (driver) 829, and on second rigid substrate 86 (may also be referred to as "second electrical wiring substrate"), photodiode 817 and its control circuit 830 (preamplifier and comparator, hereinafter referred to as "preamp") are formed or mounted. Drive circuit serves as a main circuit for electrical-optical converting circuit, and besides drive circuit, one or more components such as switching circuit, parallel-serial connection circuit, MAX/DEMAX circuit may be provided. Electrical-optical converting circuit may be a drive circuit without other components. Control circuit having a preamplifier and comparator serves as a main circuit for optical-electrical converting circuit, and besides control circuit, one or more components such as switching circuit, MAX/DE-MAX circuit may be provided. Optical-electrical converting circuit may be control circuit without other components. Electrical-optical converting circuit converts a digital electrical signal to an analog current and supplies to a light emitting device such as a laser diode 816. Optical-electrical converting circuit amplifies a weak electrical signal output from a light receiving device such as a photodiode into a digital signal with a certain pulse. Optical-electrical converting device may be a chip component having the aforementioned function. Electrical-optical converting device may be a chip component having the aforementioned function. Both substrates are optically connected through three-dimensional optical waveguide 818 (hereinafter referred to as "3D optical waveguide") formed on flexible polyimide substrate 84, or electrically connected through electrical wiring 87. Electrical wiring 87 is usually formed on polyimide substrate 84 as shown in FIG. 1, but it may also be formed on a different flexible substrate. Rigid substrates 85, 86 are connected to a mounting substrate such as a line card through an electrical interface such as BGA 88 formed on the bottom surface. Also, since laser diode 816 is an edge-emitting type and photodiode 817 is an edge-receiving type, they can make a direct optical connection with 3D waveguide 818. Accordingly, optical circuits can be simplified, compared with a standard surface-emitting and -receiving type optical interconnect device.

FIG. 2 is a side view illustrating another embodiment of the optical interconnect device described with reference to FIG. 1, but where the electrical interface is formed as a detachable electrical connector terminal 89. Flexible electrical substrate 827 is electrically connected to rigid substrates 85, 86, and each end is processed as a terminal so that the end can be connected to connector 828.

FIG. 3 is a side view showing an exemplary structure of the optical interconnect device described with reference to FIG. 2, but where rigid-flexible substrate 805 is used for mounting optical and electrical components. Since electrical wiring components between two substrates are not required, the structure can be simplified.

FIGS. 4(a) to 4(e) are side views showing exemplary structures of the optical interconnect device described with reference to FIG. 2, but where a mounting substrate for mounting optical and electrical components is a single flexible electrical substrate 827. In flexible electrical substrate 827, the region where laser diode 816 and electro-optical converter circuit or electro-optical converter element 829 are formed or mounted is a first electrical wiring portion. And the region where photodiode 817 and an optical-electro converter circuit or optical-electro converter element 830 are formed or mounted is a second electrical wiring portion. The substrate portion where components are mounted may be reinforced with stiffener 80 or the like. Since all the components are integrated on a single flexible substrate, the size can be designed compactly and its manufacturing cost can be decreased. As shown in FIG. 4(b), optical waveguide 818 may be formed on flexible electrical substrate 827. Also, as shown in FIG. (a), a substrate having optical waveguide 818 formed on flexible substrate 84 and flexible electrical substrate 827 may be adhered together using an adhesive layer such as a prepreg. As shown in FIG. (c), a space may be formed between flexible substrate 84 and electrical substrate 827. As shown in FIG. (d), optical waveguide 818 and flexible electrical substrate 827 may be adhered together using an adhesive layer such as a prepreg. As shown in FIG. (d), a space may be formed between optical waveguide 818 and electrical substrate 827.

FIG. 4 (e) is a side view illustrating an example where a flexible substrate supporting an optical waveguide and another flexible substrate supporting an electrical wiring are attached through fixing elements at their edges. Referring to FIG. 4(e), a rigid substrate 6 is provided with a light emitting element such as a laser diode 102 and another rigid substrate 7 is provided with a light receiving element 103 such as a photo diode. A flexible substrate 2000 having an optical waveguide and another flexible substrate 2001 having an electrical wiring are connected to each other at their edge portions through fixing elements 2002, thereby forming a space between the two flexible substrates 2000, 2001.

Figure 5A:
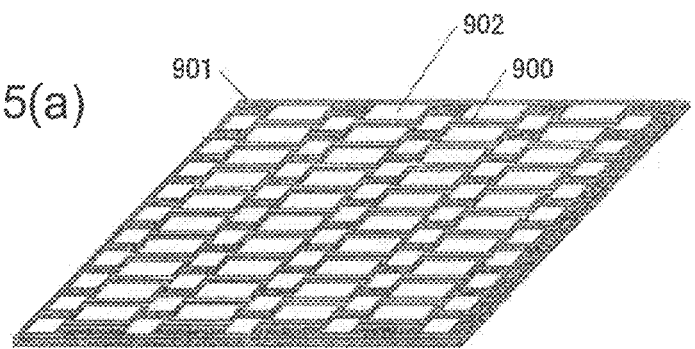
FIGS. 5(a) to 5(e) are schematic and top views illustrating a method for manufacturing an optical interconnect device according to an embodiment of the present invention, where a waveguide sheet has numerous waveguides, where a rigid mounting substrate has numerous small substrates, where a waveguide sheet and a rigid mounting substrate are laminated together, where electrical and optical components are mounted on the laminated substrate, and where an optical interconnect device is cut out unit by unit.
Figure 5B:
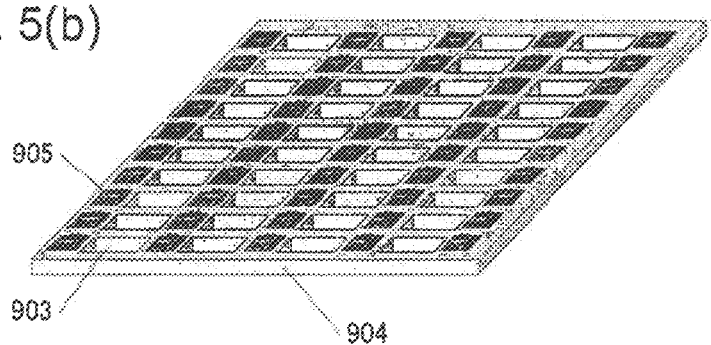
Figure 5C:
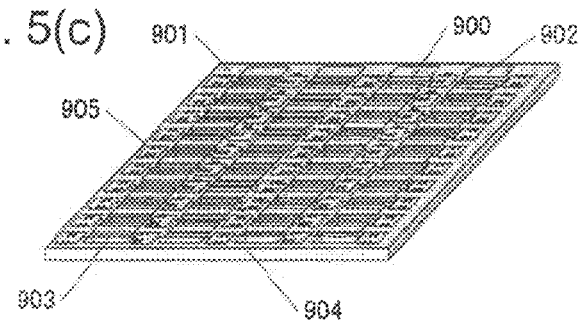
Figure 5D:
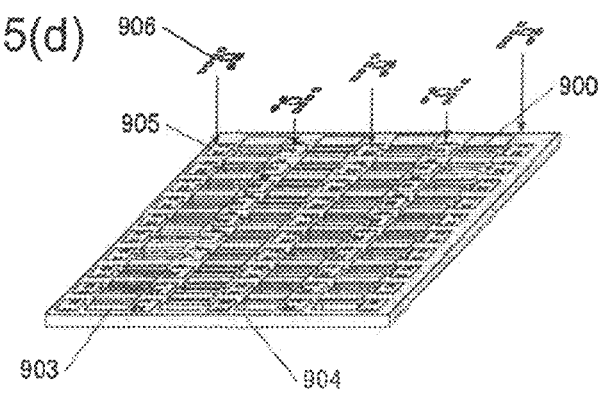
Figure 5E:
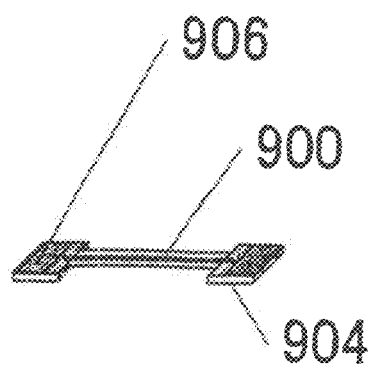

FIGS. 5(a) to 5(e) are schematic and top views illustrating a method for manufacturing an optical interconnect device according to an embodiment of the present invention, where a mounting substrate is a rigid substrate. FIG. 5(a) illustrates waveguide sheet 901 on which numerous optical waveguides 900 are formed. In waveguide sheet 901, through-holes 902 are formed such that the sections which overlap the areas where electrical and optical components will be mounted is removed. FIG. 5(b) shows rigid mounting substrate 904, onto which waveguide sheet 901 is laminated. On this substrate, mounting areas 905 for arranging mounting pads and electrical wirings of electrical and optical components are formed. Waveguide windows 903 are formed in areas where they overlap optical waveguides. First, as shown in FIG. 5(c), waveguide sheet 901 is laminated onto mounting substrate 904 by using prepreg or the like. Next, as shown in FIG. 5(d), electrical and optical components 906 are mounted on mounting areas 905, and then sealed by potting resin for protection. Lastly, as shown in FIG. 5(e), optical interconnect devices are cut out unit by unit and optical interconnect devices each having mounting substrate 904, optical waveguide 900, and optical and electrical components 906 are completed.

Figure 6A:
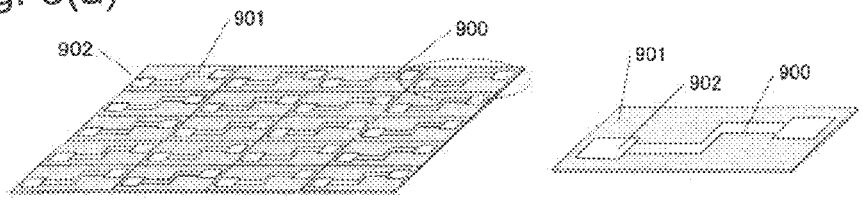
FIGS. 6(a) to 6(e) are schematic views illustrating a method for manufacturing an optical interconnect device according to an embodiment of the present invention, where a waveguide sheet has numerous waveguides, where a flexible mounting substrate has numerous small substrates, where a waveguide sheet and a flexible mounting substrate are laminated together, where electrical and optical components are mounted on the laminated substrate, and where an optical interconnect device is cut out unit by unit.
Figure 6B:
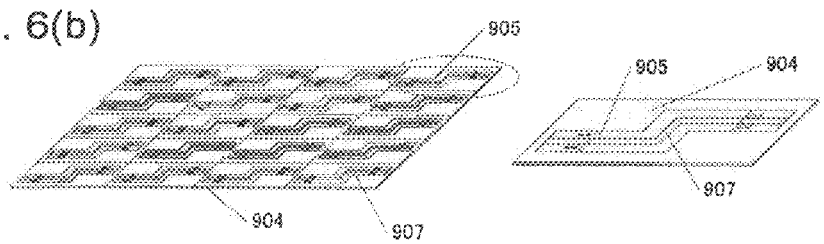
Figure 6C:
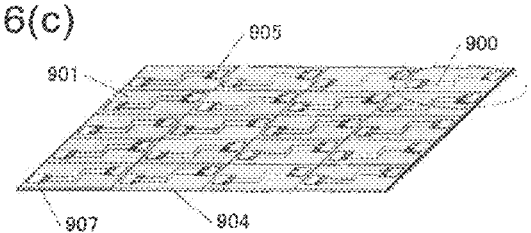
Figure 6D:
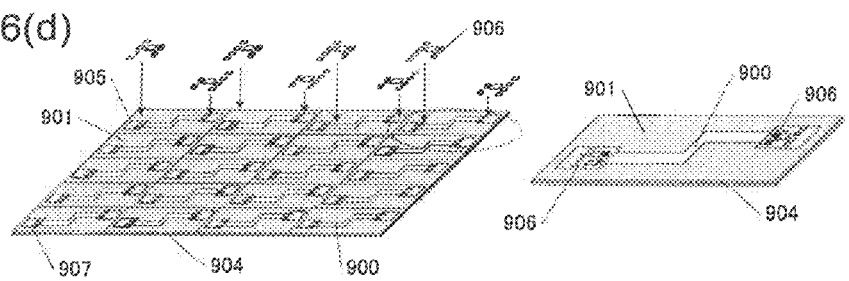
Figure 6E:

FIGS. 6(a) to 6(e) are schematic views illustrating a method for manufacturing an optical interconnect device according to another embodiment of the present invention, where a mounting substrate is a flexible substrate. FIG. 6(a) shows waveguide sheet 901, where numerous optical waveguides 900 are formed. In waveguide sheet 901, through-holes 902 are formed such that the sections which overlap the areas where electrical and optical components will be mounted is removed. FIG. 6(b) show flexible mounting substrate 904, onto which waveguide sheet 901 is laminated. On this substrate, mounting areas 905 for arranging mounting pads and electrical wirings 907 of electrical and optical components are formed. First, as shown in FIG. 6(c), waveguide sheet 901 is laminated onto mounting substrate 904 by using prepreg or the like. Next, as shown in FIG. 6(d), electrical and optical components 906 are mounted on mounting areas 905, and then sealed by potting resin for protection. Lastly, as shown in FIG. 6(e), optical interconnect devices are cut out unit by unit and optical interconnect devices each having mounting substrate 904, optical waveguide 900, optical and electrical components 906 are completed.

FIGS. 7(a) to 7(e) are cross-sectional and top views illustrating a method for manufacturing an optical interconnect according to another embodiment of the present invention. A flexible substrate such as polyimide substrate 1 is prepared as a starting material (FIG. 7(a)). On substrate 1, lower clad layer 2, core layer 3 and upper clad layer 4 are coated (FIG. 7(b)). At this step, flexible two dimensional optical substrate 5 (hereinafter referred to as "2D optical substrate") is completed. For the lower clad layer, core layer and upper clad layer, combinations of materials shown in Table 1 below may be used.

TABLE 1

| Examples | lower clad layer refractive index | Core layer refractive index | upper clad layer refractive index |
|---|---|---|---|
| 1 epoxy-based polymer | 1.593 | 1.615 | 1.593 |
| 2 acrylic-based polymer | 1.505 | 1.522 | 1.505 |

Figure 7A:
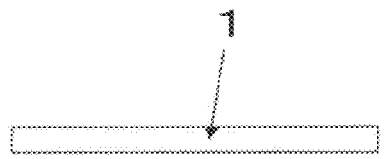
Figure 7B:
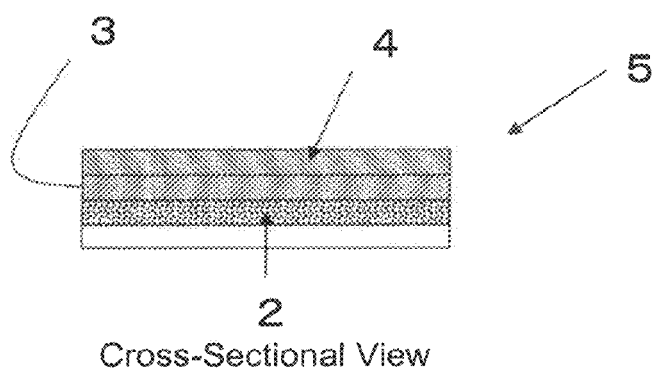
Figure 7C:
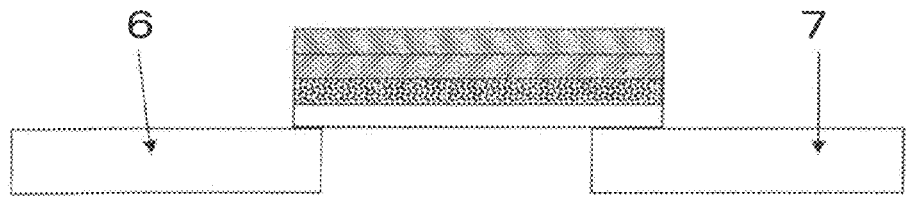
Figure 8A:
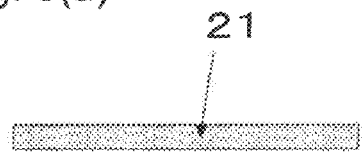
Figure 8B:
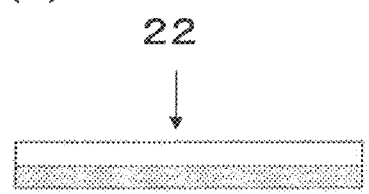
Figure 8C:
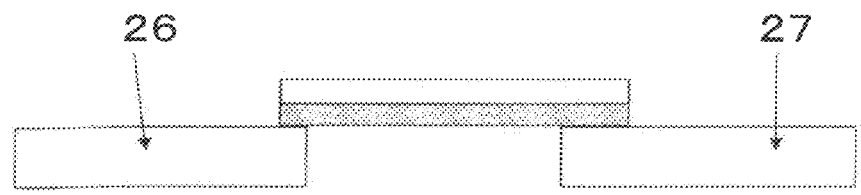
Figure 8F:
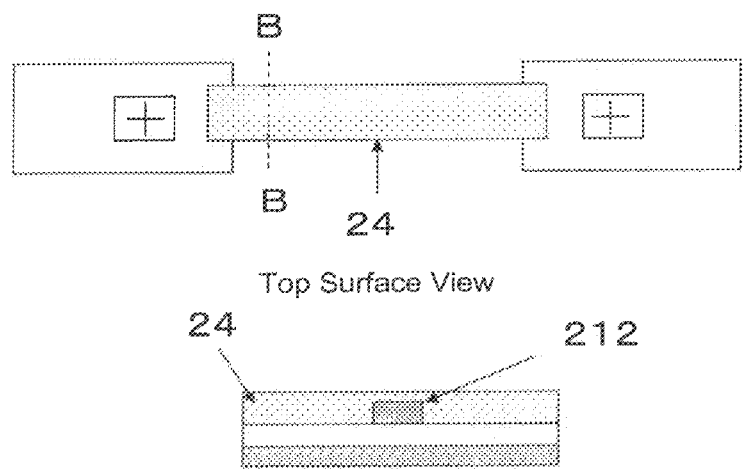

Then, flexible 2D optical substrate 5 is fixed on first substrate 6 and second substrate 7 (FIG. 7(c)). As material for first substrate 6 and second substrate 7, a flexible substrate such as polyimide or a rigid substrate reinforced with glass cloth can be used. After that, laser diode 8, having alignment mark 10 formed according to the light-emitting position, is mounted on the first substrate, and photodiode 9, having alignment mark 11 formed according to the light-receiving position, is mounted on the second substrate (FIG. 7(d)). In this example, alignment mark 10 on the laser diode is formed directly above the center of the light-emitting position, and alignment mark 11 on the photodiode is formed directly above the center of the light-receiving position. Following that, by beaming a $CO_2$ laser at the position parallel to and 25 µm apart from the straight line connecting alignment mark 10 and alignment mark 11, 3D optical waveguide 12 (approximately 50 µm wide) is formed after removing at least the upper clad layer and the core layer (FIG. 7(e)). In this example 1, the 3D optical waveguide is formed according to the alignment marks, which identify light-emitting and light-receiving positions of the optical components. Thus, optical components such as laser diode 8 and photodiode 9 and the 3D optical waveguide can be aligned precisely, and the connection loss between the waveguide and optical components is reduced.

FIGS. 8(a) to 8(d) are cross-sectional and top views illustrating a method for manufacturing an optical interconnect according to another embodiment of the present invention. A flexible substrate such as polyimide substrate 21 is prepared as a starting material (FIG. 8(a)). On substrate 21, lower clad layer 22 is formed by coating, for example, an epoxy-based polymer resin (FIG. 8(b)). After that, the above-described unfinished substrate 21 is laminated on first substrate 26 and second substrate 27 (FIG. 8(c)). In the following, laser diode 28, having alignment mark 210 formed according to the light-emitting position, is mounted on the first substrate, and photodiode 29, having alignment mark 211 formed according to the light-receiving position, is mounted on the second substrate (FIG. 8(d)). In this example, alignment mark 210 on the laser diode is formed directly above the center of the light-emitting position, and alignment mark 211 on the photodiode is formed directly above the center of the light-receiving position. Following that, on the line connecting alignment marks 210 and 211, 3D core 212 is formed to be 50 µM wide and 50 µm high by using an ink-jet method. 3D core 212 is made of an epoxy-type polymer resin with a greater refractive index than the above lower clad layer 21 (FIG. 8(e)). After the core is dried, the same epoxy-type polymer resin used for forming the lower clad layer is coated on the lower clad layer and the core. Accordingly, a 3D optical waveguide is made where core 212 is enclosed by lower clad layer 21 and upper clad layer 24 (FIG. 8(j)). In this example, the material to form the core is coated according to alignment marks 210, 211. Thus, laser diode 28 and photodiode 29 and the 3D optical waveguide can be aligned precisely and the connection loss between the waveguide and optical components is reduced.

Figure 9A:
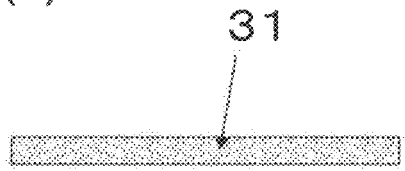
Figure 9B:
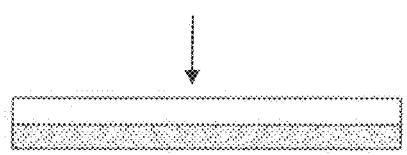
Figure 9C:
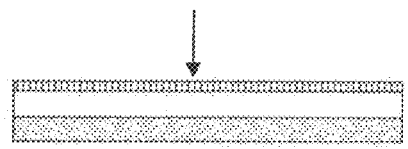
Figure 9D:
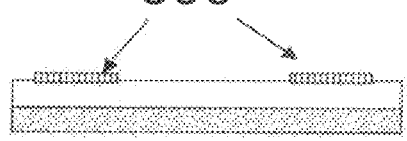
Figure 9G:
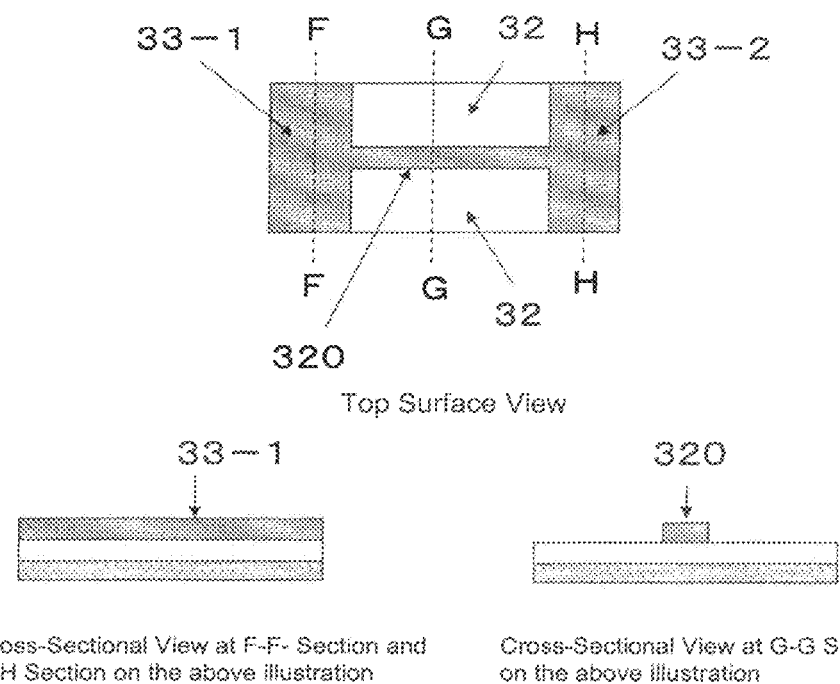
Figure 9H:
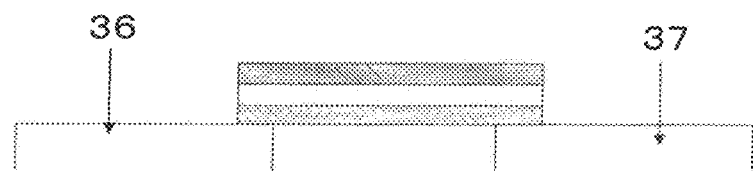

FIGS. 9(a)-9(k) are cross-sectional and top views illustrating a method for manufacturing an optical interconnect device according to yet another embodiment of the present invention. A flexible substrate such as polyimide substrate 31 is prepared as a starting material (FIG. 9(a)). On substrate 31, lower clad layer 32 is formed by coating an epoxy-type polymer resin (FIG. 9(b)). Metal layer 39 is formed on the lower clad layer by vapor-depositing a metal such as copper, gold, aluminum, titanium, nickel, chrome or the like (FIG. 9(c)). Following that, an etching resist is formed on the metal layer, which is then put through a process of being exposed to light, developed and etched, to form optical waveguide alignment marks 300 on the lower clad layer (FIG. 9(d)). After that, on lower clad layer where optical waveguide alignment marks 300 are formed, core layer 33 is formed by coating an epoxy-type polymer resin having a greater refractive index than lower clad layer 31 (FIG. 9(e)). After the core layer is formed, etching resist is formed on the core layer, which is then put through a process of being exposed to light and developed to form mask 301 (FIG. 9(f)). Through a later-described reactive ion etching process, mask 301 is shaped so as to form a 3D optical waveguide at portions where both surface edges of substrate 31 are removed. The position of mask 301 is determined based on optical waveguide alignment marks 300. After the mask is formed, portions of the core layer where the mask is not formed are removed by a reactive ion etching method. Accordingly 3D optical waveguide 320 is formed in the area excluding portions near both side-surfaces of substrate 31 (FIG. 9(g) illustrate the substrate after the mask has been removed). Then, the unfinished substrate is fixed onto first substrate 36 and second substrate 37 (FIG. 9(h)). After the above, laser diode 38, having alignment mark 310 formed according to the light-emitting position, is mounted on the first substrate, and photodiode 39, having alignment mark 311 formed according to the light-receiving position, is mounted on the second substrate (FIG. 9(i)). After the optical components are mounted, based on optical waveguide alignment mark 300 and alignment mark 310 on the laser diode, the 2D core layer portion 33-1 is removed by a $CO_2$ laser to form first connection 3D waveguide 331. First connection 3D waveguide 331, positioned between 3D optical waveguide 320 and laser diode 38, is in a precise conjunction with the light-emitting position of the laser diode and is also connected to 3D optical waveguide 320. By the same manner, second connection 3D waveguide 332 is formed between 3D optical waveguide 320 and photodiode 39 (FIG. 9(*j*)). After that, on core 320, 331, 332 and the lower clad layer, upper clad layer 34 is formed by coating the same epoxy-type polymer resin as used for the lower clad layer (FIG. 9(*k*)). In this example, first connection 3D waveguide 331, which connects 3D optical waveguide 320 and the laser diode, is formed according to alignment mark 310 based on the light-emitting position as well as according to optical waveguide alignment mark 300 for forming a 3D optical waveguide. Thus, the laser diode and the first connection 3D optical waveguide, as well as the 3D optical waveguide and the first connection 3D optical waveguide, can be aligned precisely and the connection loss is reduced accordingly. The connection loss can be also reduced between the photodiode and the second connection 3D optical waveguide. In this example, the edge of at least one of the first connection 3D optical waveguide and the second connection 3D optical waveguide can be formed offset from the extension line of 3D optical waveguide 320. By forming offset from the extension line as such, the photodiode is less likely to be affected by leaked light. Alignment marks 300 are formed on lower clad layer 32, but may also be formed on other layers such as core layer 33, or may use a waveguide pattern instead of a metal pattern.

FIGS. 10(*a*) to 10(*e*) are cross-section and top views illustrating a method for manufacturing an optical interconnect device according to still another embodiment of the present invention. Since this example follows the same steps described with reference to the example shown in FIGS. 9(*a*)-9(*e*), the rest of the process is described here. After a core layer is formed, an etching resist is formed on the core layer, which is then put through a process of being exposed to light and developed to form mask 401 (FIG. 10(*a*)). By using a later-described reactive ion etching process, mask 401 is formed at the center of substrate 41 and shaped to allow a 3D optical waveguide to be formed later. As in the example shown in FIGS. 9(*a*)-9(*k*), the position of mask 401 is determined based on the optical waveguide alignment marks (not shown in the illustrations). After the mask was formed, portions of the core layer where the mask is not formed are removed by a reactive ion etching process. Accordingly, 3D optical waveguide 420 is formed in the center of substrate 41 (FIG. 10(*b*) illustrate the substrate after the mask is removed). Then, the unfinished substrate is fixed onto first substrate 46 and second substrate 47 (FIG. 10(*c*)). After that, laser diode 48, having alignment mark 410 formed according to the light-emitting position, is mounted on the first substrate, and photodiode 49, having alignment mark 411 formed according to the light-receiving position, is mounted on the second substrate (FIG. 10(*d*)). After the optical components are mounted, based on the optical waveguide alignment mark and alignment mark 410 on the laser diode, an epoxy-type polymer resin having a greater refractive index than lower clad layer 42, is coated on lower clad layer 42 by using an ink-jet method. Accordingly, first connection 3D waveguide 431 is formed between 3D optical waveguide 420 and laser diode 48. Following the same manner, second connection 3D waveguide 432 is formed between 3D optical waveguide 420 and photodiode 49 (FIG. 10(*e*)). Then, upper clad layer 44 is formed on core 420, 431, 432 and the lower clad layer by coating the same epoxy-type polymer resin used for the lower clad layer (FIG. 10(*f*)). In this example, first connection 3D waveguide 431, which connects 3D optical waveguide 420 and the laser diode, is formed according to alignment mark 410 based on the light-emitting position as well as according to the optical waveguide alignment mark for forming a 3D optical waveguide. Thus, the laser diode and the first connection 3D optical waveguide, as well as the 3D optical waveguide and the first connection 3D optical waveguide, can be aligned precisely and the connection loss is reduced accordingly. The photodiode and the second connection 3D optical waveguide can be also aligned precisely and the connection loss is reduced accordingly. In this example, the edge of at least one of the first connection 3D optical waveguide and the second connection 3D optical waveguide may be also formed offset from the extension line of 3D optical waveguide 420. By forming offset from the extension line as such, the photodiode is less likely to be affected by leaked light.

FIGS. 11(*a*) to 11(*c*) are cross-sectional and top views illustrating a method for manufacturing an optical interconnect device according to still another embodiment of the present invention. Flexible substrate 500 is prepared as a starting material, and a lower clad layer, a core layer and an upper clad layer are laminated on a section of flexible substrate 500 as described in the example shown in FIGS. 7(*a*) to 7(*e*). Then, by sandwiching the region where the lower clad layer, core layer and upper clad layer are formed, laser diode 538 having alignment mark 510 formed according to the light-emitting position, and photodiode 539 having alignment mark 511 formed according to the light-receiving position, are mounted. The area where the laser diode is mounted (to the left of the optical waveguide in FIG. 11(*c*)) is referred to as the first region (a first electrical wiring portion), and the area where the photodiode is mounted (to the right of the optical waveguide in FIG. 11(*c*)) is referred to as the second region (a second electrical wiring portion). After that, similar to the example shown in FIGS. 7(*a*) to 7(*e*), according to alignment marks 510, 511 on the optical components, grooves are formed in the core layer and upper clad layer to make a 3D waveguide (see FIG. 7(*e*)). Data transmission between the first region and second region is conducted through the 3D optical waveguide. In this example, a lower clad layer, a core layer and an upper layer were formed on the flexible substrate, but another substrate made of a lower clad layer, a core layer and an upper clad layer may be prepared separately and then laminated on flexible substrate 5 by using an adhesive such as a prepreg or the like.

Figure 12A:
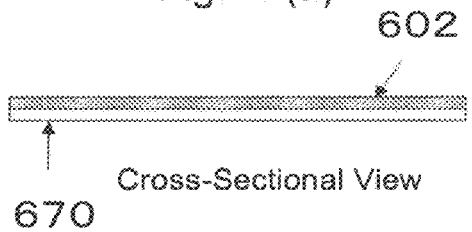
FIGS. 12(a) to 12(c) are cross-sectional and top views illustrating a method for manufacturing an optical interconnect device according to an embodiment of the present invention, including a view after a lower clad layer has been formed, a view after the unfinished substrate shown in FIG. 12 (a) has been laminated onto a flexible substrate, and views after optical components have been mounted on the substrate shown in FIG. 12 (b)
Figure 12B:
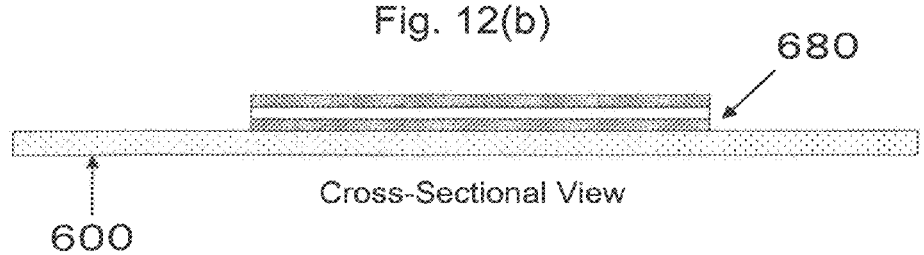
Figure 12C:
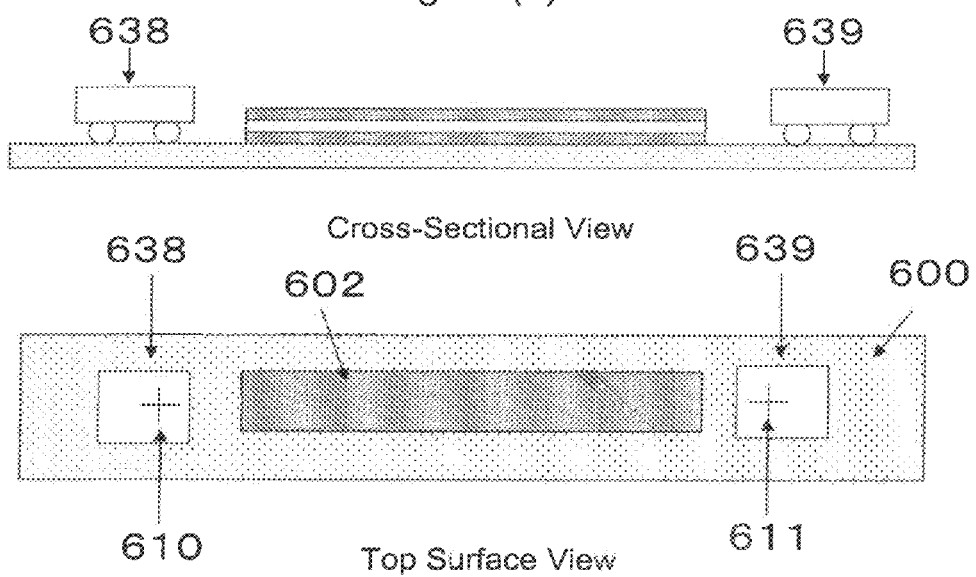

FIGS. 12(*a*) to 12(*c*) are cross-sectional and top views illustrating a method for manufacturing an optical interconnect device according still another embodiment of the present invention. Lower clad layer 602 is coated on flexible holding substrate 670 (FIG. 12(*a*)). Then, the substrate after a clad layer has been coated and flexible substrate 600 are laminated via prepreg 680 (FIG. 12(*b*)). After that, by sandwiching holding substrate 670, laser diode 638, having alignment mark 610 formed according to the light-emitting position, and photodiode 639, having alignment mark 611 formed according to the light-receiving position, are mounted. The area where the laser diode is mounted (to the left of the optical waveguide in FIG. 12(*c*)) is referred to as the first region, and the area where the photodiode is mounted (to the right of the optical waveguide in FIG. 12(*c*)) is referred to as the second region. Data transmission between the first region and the second region is carried out through a 3D optical waveguide. After the above, a 3D optical waveguide is formed by following similar steps described with reference to FIG. 8(*e*).

A method for manufacturing an optical interconnect device according to yet another embodiment of the present invention is described. This example is substantially similar to the example shown in FIGS. 9(*a*) to 9(*k*). In that example, the substrate having an optical waveguide is laminated on two substrates, whereas in this example, the substrate having an optical waveguide is laminated on one flexible substrate as in the example referring to FIGS. 12(*a*) to 12(*c*). The manufacturing steps in this example are similar to those described with reference to FIGS. 9(a)-9(g). Then, the unfinished substrate prepared by following the steps described with reference to FIGS. 9(a)-9(g) is laminated on a single flexible substrate in a similar way as in the example referring to 12(a) to 12(c). Following that, by sandwiching the unfinished substrate, optical components are mounted on the flexible substrate (see FIG. 12(c)). The manufacturing procedures after mounting optical components are similar to those described with reference to FIGS. 9(j)-9(k).

Figure 10A:
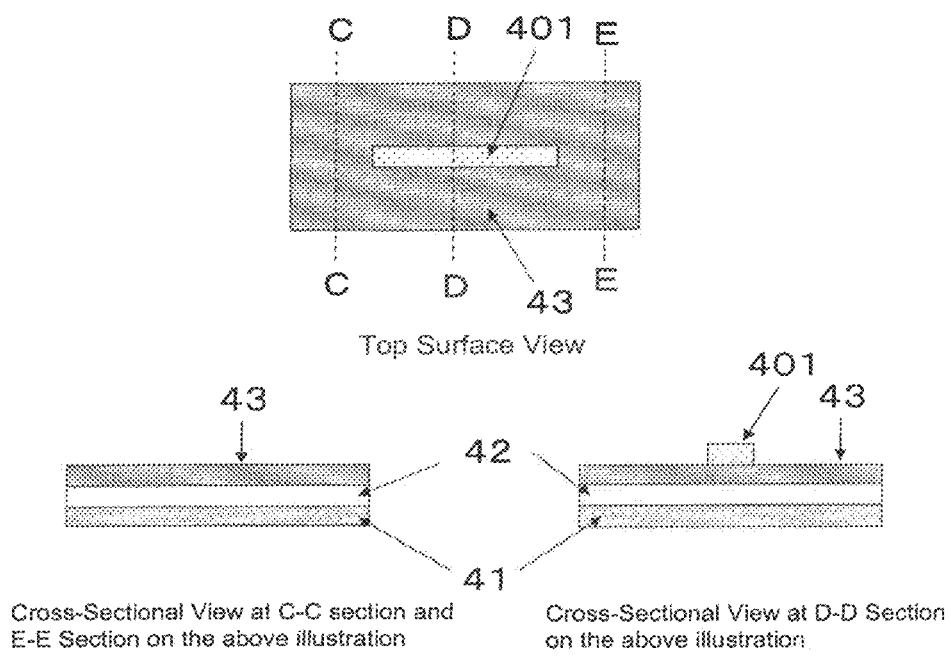
FIGS. 10(a) to 10(f) are cross-sectional and top views illustrating a method for manufacturing an optical interconnect device according to an embodiment of the present invention, including views after a mask has been formed on a core layer, views after the core excluding the portion beneath the mask shown in FIG. 10(a) has been removed using the mask, and then the mask has been peeled away, a view after the substrate in FIG. 10(b) has been fixed on other substrates, views after optical components have been mounted on the substrates shown in FIG. 10(c), views after a 3D core has been formed according to the manufacturing method, and a view after an upper clad layer has been formed on the substrate shown in FIG. 10(e)
Figure 10B:
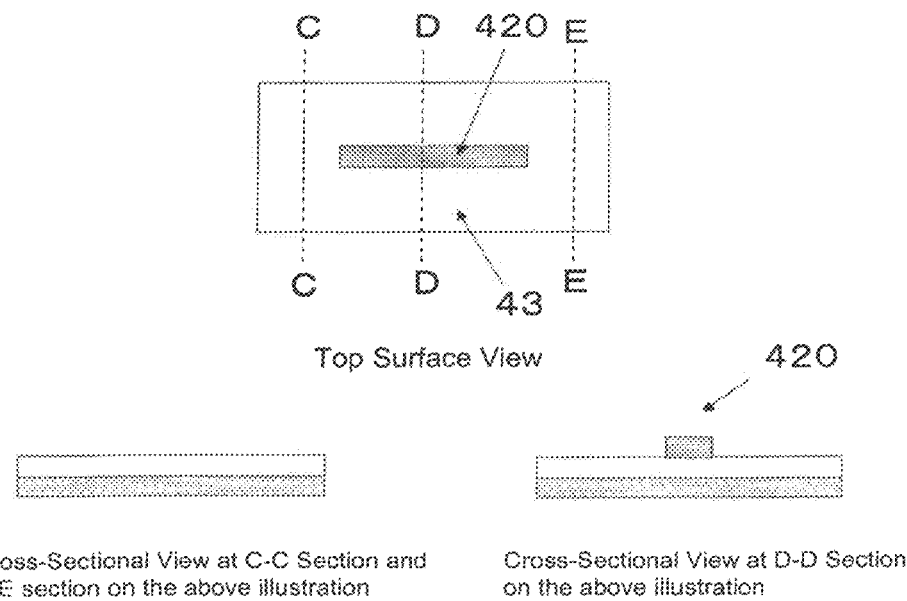
Figure 10C:
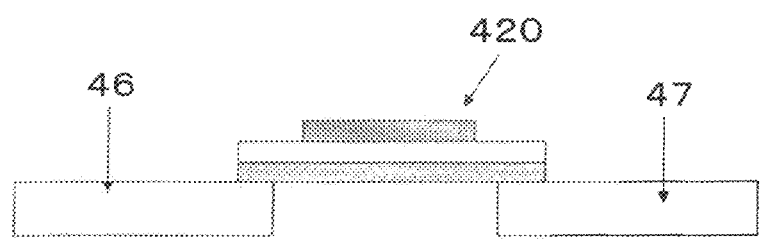
Figure 10D:
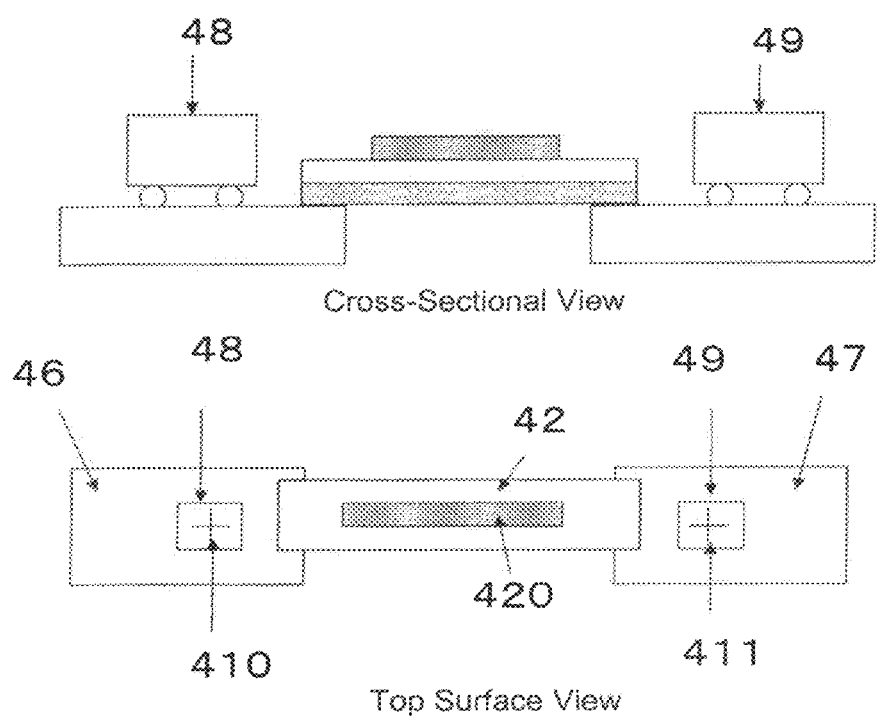
Figure 10E:
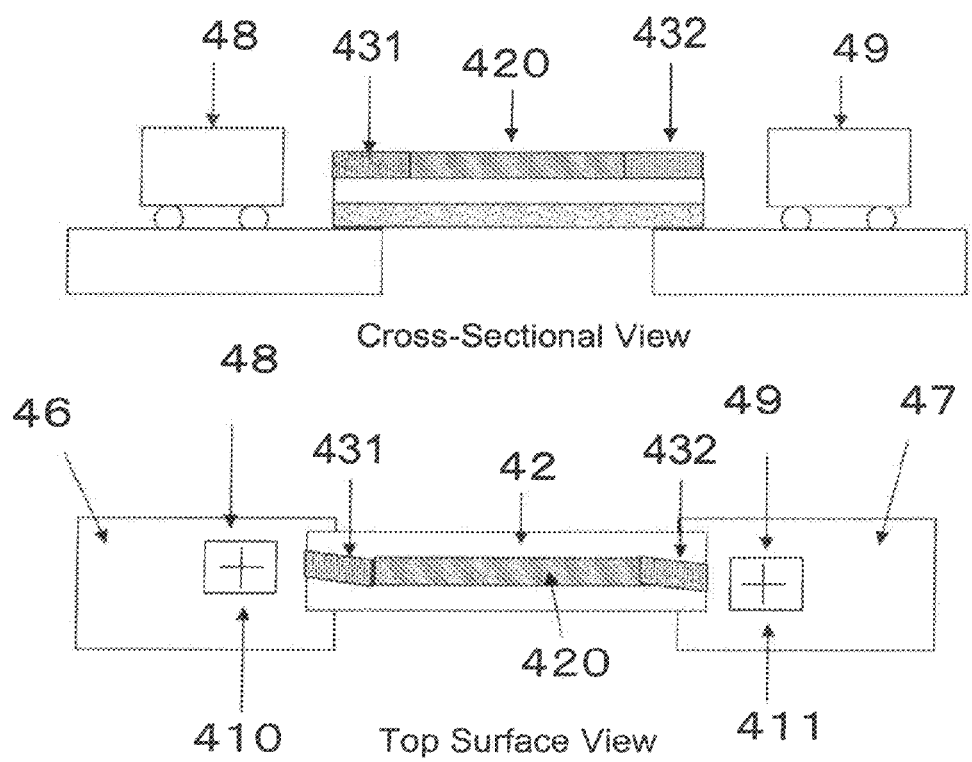
Figure 10F:
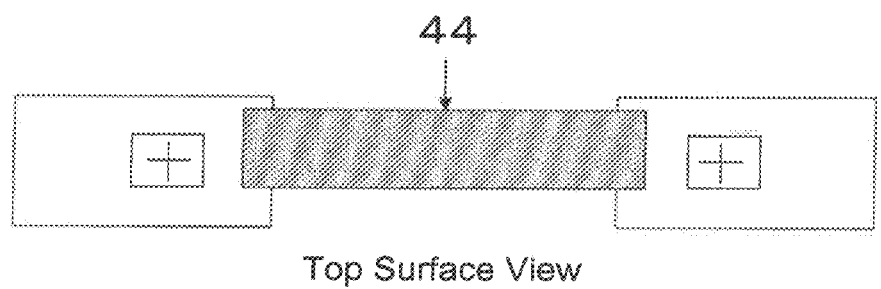

A method for manufacturing an optical interconnect device according to yet another embodiment of the present invention is described. This example is substantially similar to the example referring to FIGS. 10(a) to 10(f). In that example, the substrate having an optical waveguide is laminated on two substrates, whereas in this example, the substrate having an optical waveguide is laminated on one flexible substrate as described in the example referring to FIGS. 12(a) to 12(c). The manufacturing steps in this example are similar to those described with reference to FIGS. 10(a)-10(b). Then, the unfinished substrate prepared by following the steps described with reference to FIGS. 10(a)-10(b) is laminated on a single flexible substrate as described in the example referring to FIGS. 12(a) to 12(c). Following that, by horizontally sandwiching the unfinished substrate, optical components are mounted on the flexible substrate (see FIG. 12(c)). After the optical components are mounted, the manufacturing steps are similar to those in FIGS. 10(e)-10(f).

The end surface of the 3D optical waveguide described in the foregoing examples (the surface facing the optical component) is approximately rectangular. However, the shape may also be a tapered shape as shown in FIGS. 13 and 14. FIG. 13 illustrates a top view of the 3D optical waveguide facing the laser diode. Referring to FIG. 13, the opening toward the laser diode (illustrated on the left) is made wider than the rest of the waveguide. With such a structure, the alignment gap tolerance between the 3D optical waveguide and the laser diode is made larger. FIG. 14(a) illustrates a top view of the 3D optical waveguide facing the photodiode (illustrated on the right). In FIG. 14(a), the opening toward the photodiode is made narrower than the rest of the waveguide. Since the spot diameter of the light transmitted from the 3D optical waveguide is large, the alignment gap tolerance between the 3D optical waveguide and the photodiode is made larger. FIG. 14(b) illustrates a 3D optical waveguide where an opening toward a laser diode (illustrated on the left) is made wider than the rest of the waveguide, and the opening toward a photodiode (illustrated on the right) is made narrower than the rest of the waveguide.

FIG. 15 is a top view illustrating an example of a 3D optical waveguide where the end facing a photodiode is split and each split 3D optical waveguide is connected to the photodiode. By doing so, light output from one of the waveguides can be input into the photodiode. Thus, the alignment gap tolerance between the waveguide and photodiode is made larger. In this example, it was split into two, but the number of splits may be two or more.

Figure 16A:
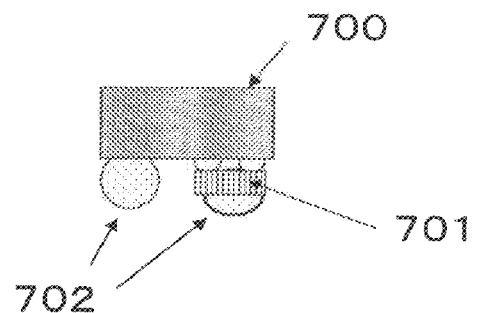
FIGS. 16(a) and 16(b) are side views illustrating steps of mounting optical components on a substrate.
Figure 16B:
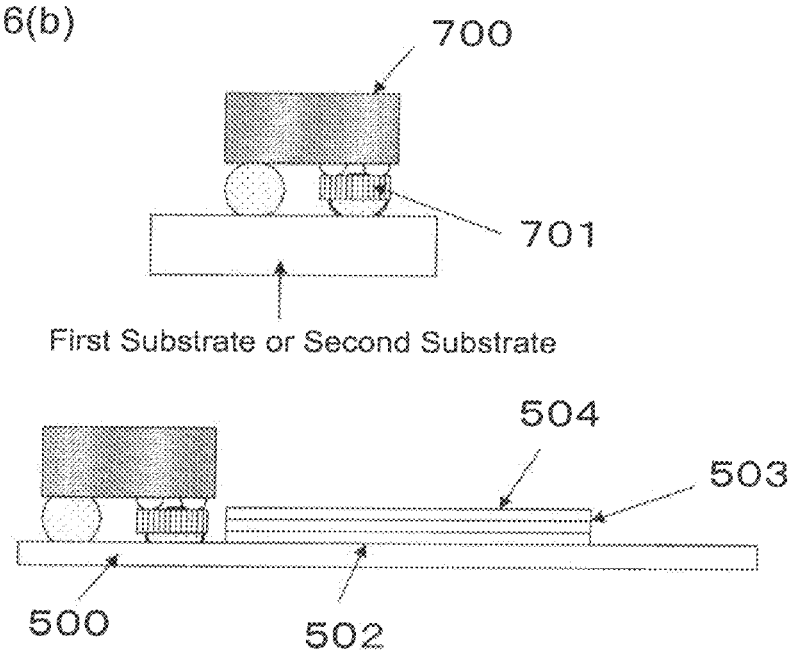
Figure 17A:
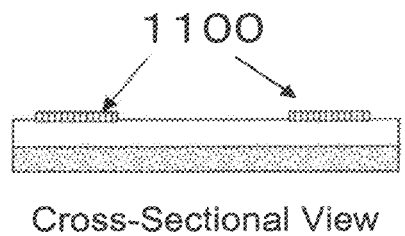
FIGS. 17(a) to 17(f) are cross-sectional and top views illustrating a method for manufacturing an optical interconnect device according to an embodiment of the present invention, including a view after the optical waveguide alignment marks have been formed on a clad layer, a view after a core layer has been formed on the substrate shown in FIG. 17(a), views after a mask has been formed on the substrate shown in FIG. 17(b), views after a 3D optical waveguide has been formed using the mask shown in FIG. 17(c), views after the substrate shown in FIG. 17(d) has been laminated on a flexible substrate, and a view after mounting pads for optical components have been formed.
Figure 17B:
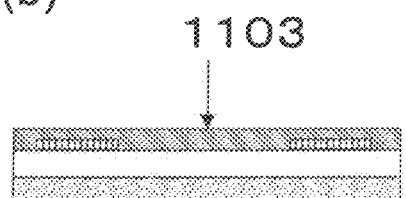
Figure 17C:
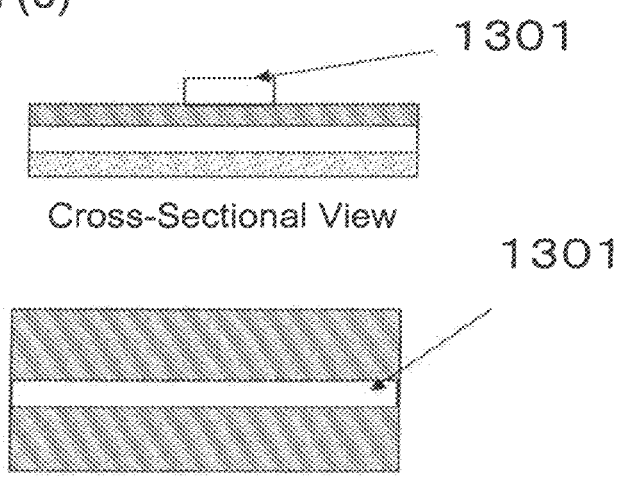
Figure 17D:
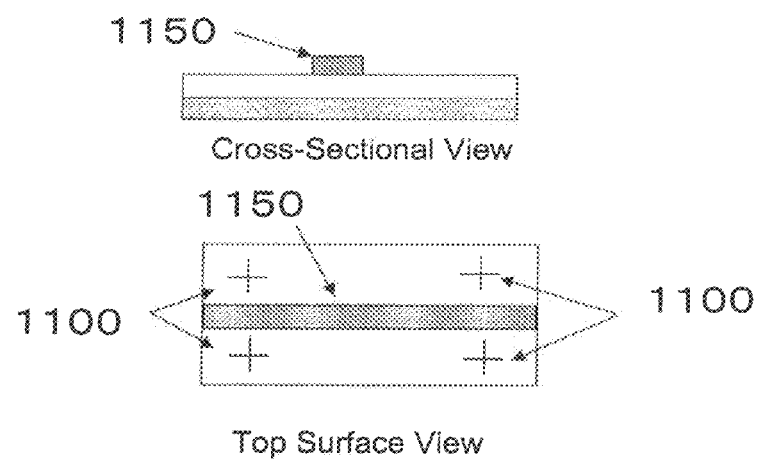
Figure 17E:
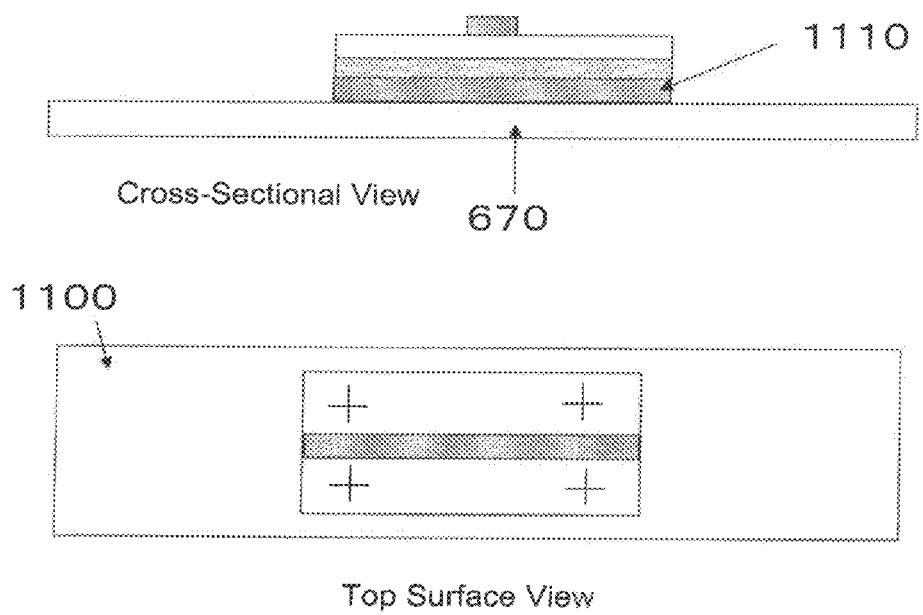
Figure 17F:
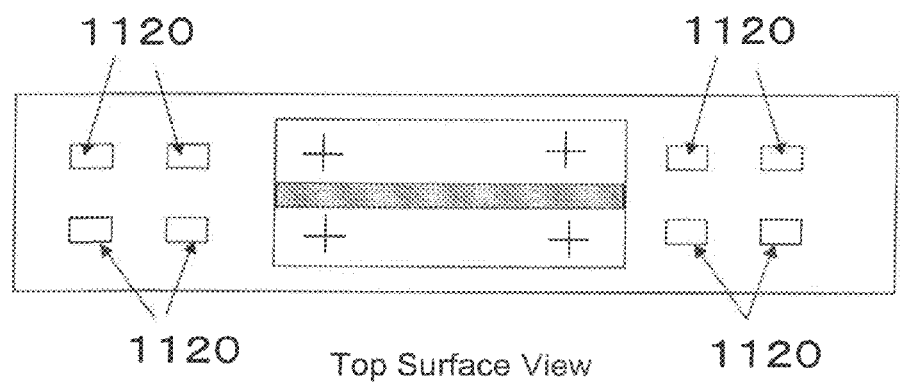

Referring to the foregoing examples, optical components are mounted on a first substrate, a second substrate and/or a flexible holding substrate. However, as illustrated in FIG. 16(a), on a rigid substrate or flexible substrate 700 for mounting optical components, optical component 701 such as photodiode, laser diode or the like are mounted, and then the flexible holding substrate and optical components may be mounted on the first substrate, the second substrate, or the flexible holding substrate.

An electrical circuit may be formed between the first substrate (the first region) and the second substrate (the second region) so that both optical transmission and electrical transmission are used for data transmission between the first substrate (the first region) and the second substrate (the second region).

Connecting optical components and substrates is not limited to using connection via solder bumps (flip-chip connection); surface-mounting methods such as wire bonding may also be employed.

In the above-described examples, alignment marks on optical components are formed directly above either the light-emitting position or the light-receiving position, but alignment marks are not limited to such positions or the numbers described in the examples in FIGS. 7(a)-10(f).

In the above-described examples, 3D optical waveguides are formed based on the alignment marks on optical components. However, according to optical waveguide alignment marks 1100 for forming a 3D optical waveguide, optical components may be aligned, and then mounted on the first substrate, second substrate or the flexible holding substrate. An example for the above is illustrated in FIGS. 17(a) to 17(f). Optical waveguide alignment marks 1100 are formed on a lower clad layer (see FIG. 17(a)). Then, core layer 1103 is formed (see FIG. 17(b)). After that, similar to those as in the example in FIGS. 9(a) to 9(k), mask 1301 is formed on the core layer according to optical waveguide alignment marks 1100 (see FIG. 17(c)). Then, 3D optical waveguide 1150 is formed by using mask 1301 (see FIG. 17(d)). The unfinished substrate is laminated on flexible holding substrate 670 via prepreg 1100 (see FIG. 17(e)). Then, according to optical waveguide alignment marks 1100, conductive portions (component-mounting pads) 1120 are formed on flexible holding substrate 670 (see FIG. 17(f)). Regarding conductive patterns 1120, for example, pad openings are formed by irradiating a $CO_2$ laser on the solder resist laminated on the conductor portion. Through such component-mounting pads, optical components (including a laser diode and photodiode) are mounted on the surface. In the example described with reference to FIGS. 17(a) to 17(f), since the 3D optical waveguide is formed and optical components are mounted according to optical waveguide alignment marks 1100, the 3D optical waveguide and the optical components can be precisely aligned.

The 3D optical waveguides described in the foregoing examples may also be shaped as illustrated in FIGS. 13, 14(a) and 14(b).

The laser diode is preferably an edge-emitting type and the photodiode is preferably an edge-receiving type.

The laser diode may be a single mode pulse type, and the optical waveguide may be a multimode type. As such, the optical waveguide and optical component can be aligned easily.

Figure 18:
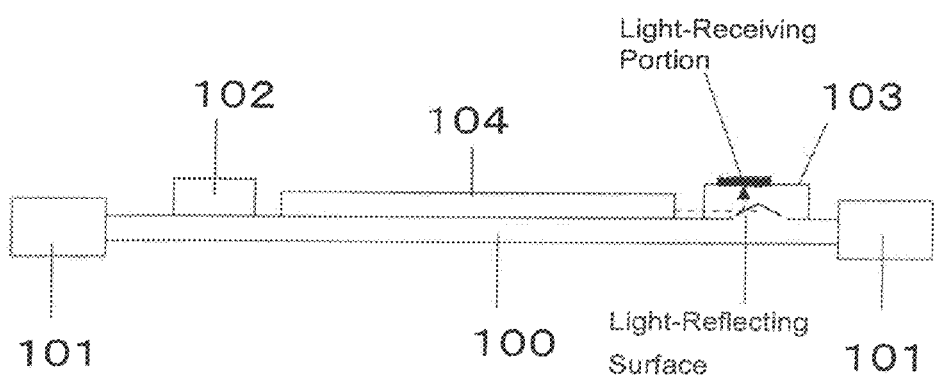
FIG. 18 is a side view illustrating one type of photo diodes.

FIG. 18 is a side view illustrating an example where the photodiode has a different structure. As shown in the illustration, the photodiode according to this example makes light input to the photodiode reflects off a mirror facing the light-receiving portion and reaches the light-receiving portion formed on the upper area of the photodiode (the light path is shown in the illustration). Also, in this example, connector 101 is formed on each end of flexible substrate 100, which is electrically connected to other substrates (for example, a motherboard) via connectors 101.

Figure 19A:
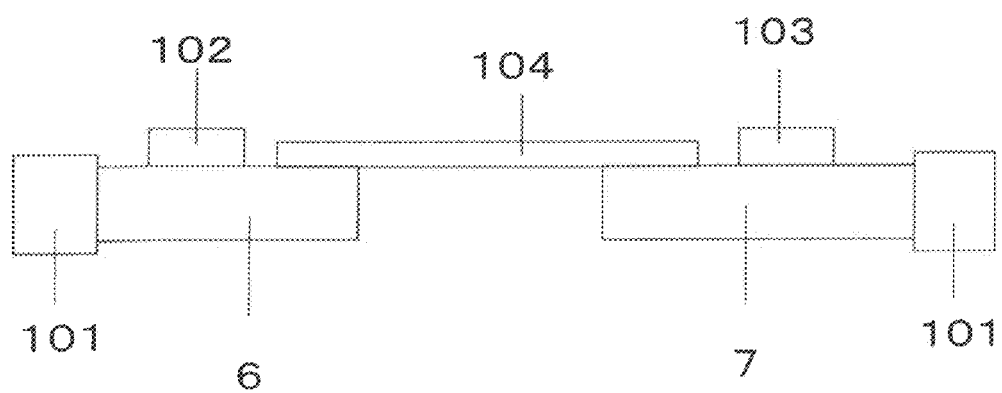
FIGS. 19(a) and 19(b) are side views illustrating examples where connectors are attached to a first substrate, second substrate or flexible substrate.
Figure 19B:
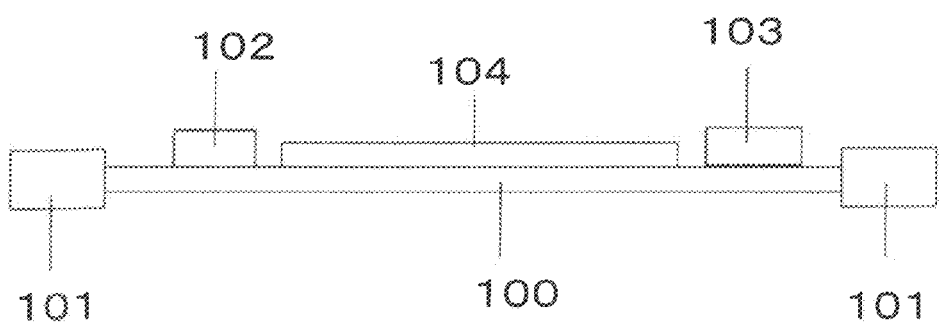

In any of the examples described above, the photodiode shown in FIG. 18 may be used. Furthermore, in any of the examples described above, as illustrated in FIG. 19(a), connectors may be provided to an end surface of the first substrate and to an end surface of the second substrate so that the substrates are electrically connected to other substrates (for example, a motherboard). In an example such as the example in FIGS. 17(a) to 17(c), where an optical waveguide and optical components are mounted on a single substrate (including a flexible substrate, a rigid substrate and a partially rigid flexible substrate), a connector may also be provided to each end surface of the substrate as illustrated in FIG. 19(b) so that the substrate is electrically connected to other substrates (for example, a motherboard).

Figure 20A:
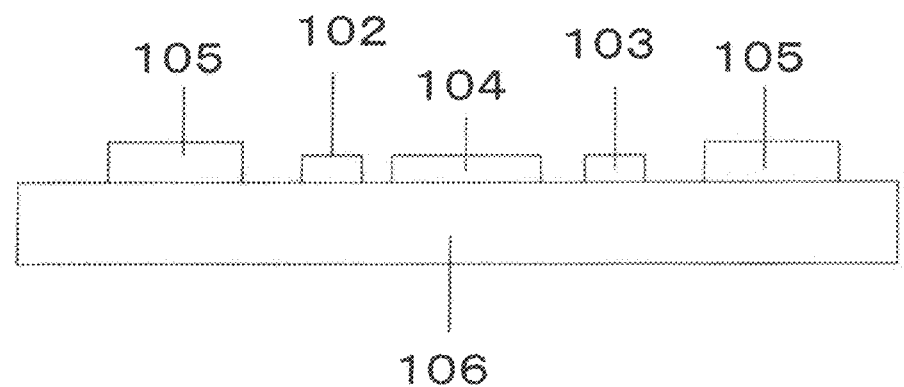
FIGS. 20(a) and 20(b) side views illustrating examples where semiconductor elements are mounted on first substrate, second substrate or a printed wiring board substrate.
Figure 20B:
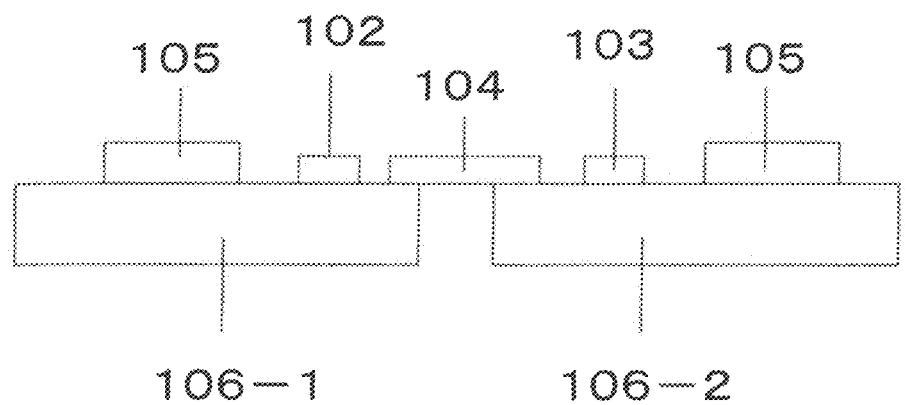

In any of the above-described examples, on a first substrate, second substrate, first region or second region, semiconductor elements may be mounted (see FIGS. 20(a)-20(b)). Part of the Signal transmission between semiconductor elements is carried out through the optical waveguide. On printed wiring board 106, first substrate 106-1 and second substrate 106-2, electrical circuits are formed. In the example with reference to FIG. 20(b), an electrical circuit is formed on the optical waveguide as well. Signals can be transmitted from semiconductor element to semiconductor element through the optical waveguide, and power-source and ground can be transmitted from semiconductor element to semiconductor element through the electrical circuit. Signals at a predetermined speed (for example, 1 Gb/s.) or above may also be transmitted from semiconductor element to semiconductor element through the optical waveguide (signals slower than the predetermined speed are transmitted from semiconductor element to semiconductor element through the electrical circuit.) At that time, a circuit or an element to determine the signal speed may be mounted on the printed wiring board (including the first substrate and second substrate).

Figure 21:
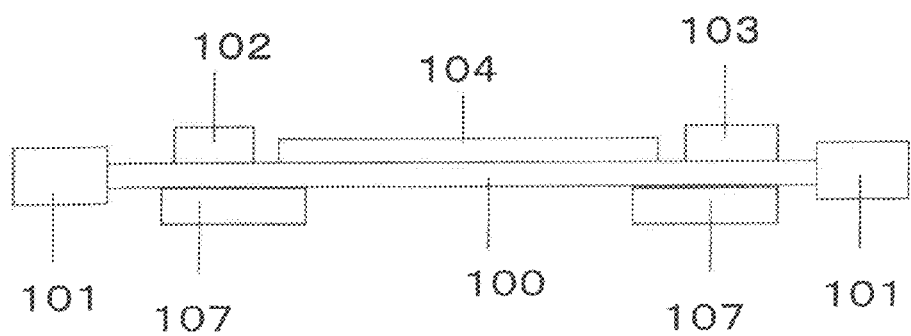
FIG. 21 is a side view illustrating an example where reinforcing layers are attached to a flexible substrate.

FIG. 21 illustrates an example where reinforcing layers 107 are attached to the surface opposite where optical components are mounted. With such a structure, optical components can be mounted easily on the flexible substrate. To reduce connection loss, reinforcing layer 107 is preferred to be disposed so that flexible substrate 100 between the optical components (laser diode, photodiode) and the optical waveguide will not warp. For example, a board-shaped reinforcing layer is preferably formed or laminated on flexible substrate 100, on the surface opposite the surface where the optical components are mounted, including the area directly under the optical components and at least directly under the edge of the optical waveguide.

Figure 22A:
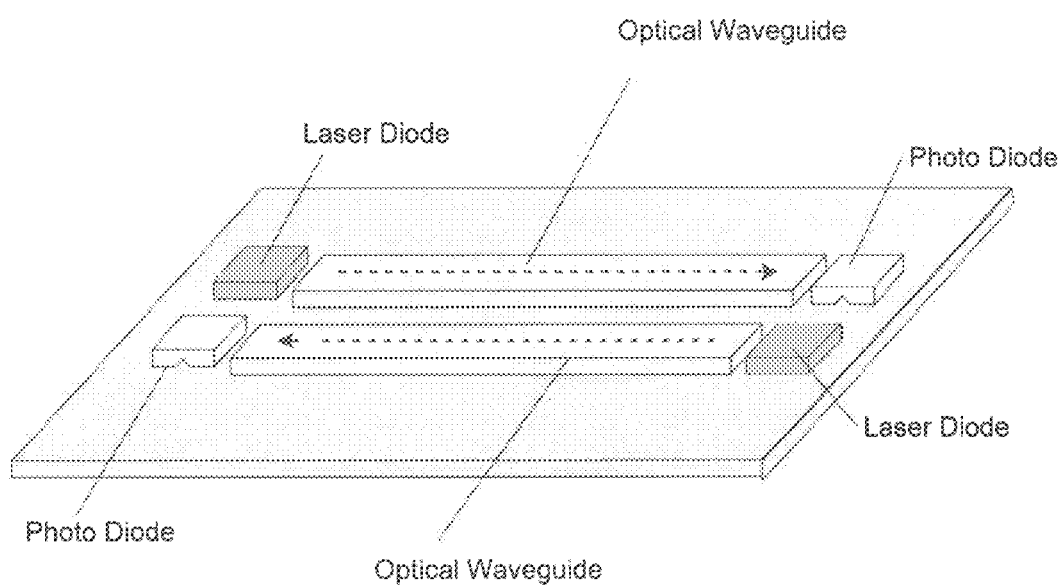
FIGS. 22(a) and 22(b) are schematic views illustrating examples of laser diodes and photodiodes being mounted.
Figure 22B:
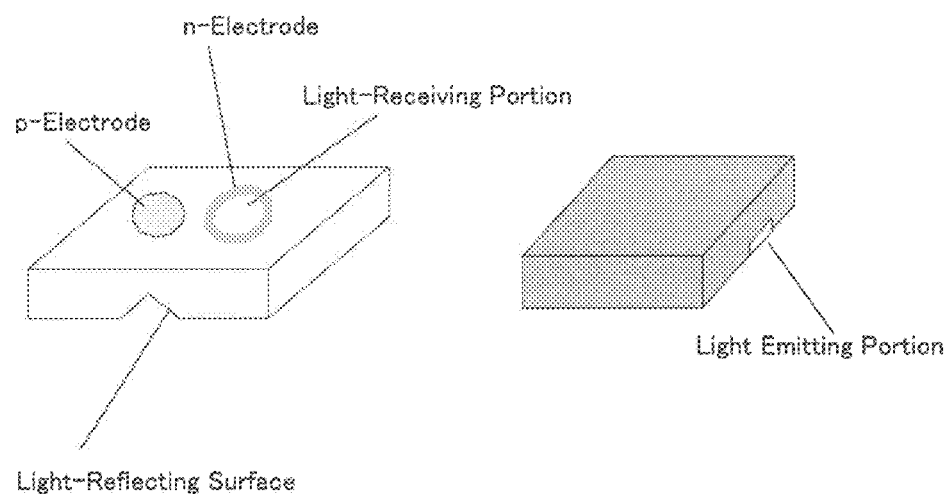

FIG. 22(a) is a schematic view illustrating an example using the photodiode (edge-receiving component) and the laser diode (edge-emitting component) shown in FIG. 22(b). The photodiode has a light-emitting spot around the bottom surface and is mounted facedown. The photodiode has a reflecting surface placed opposite the light-receiving spot as shown in FIG. 22(b) and is mounted face-up. As shown, in the light-receiving element (photodiode), a reflecting surface (mirror) is formed on the element substrate. As illustrated in FIG. 22(b), the light-receiving element may have a p-electrode and an n-electrode on one surface and the light-emitting element may also have a p-electrode and an n-electrode on one surface.

A laser diode having an alignment mark and a photodiode having an alignment mark are referenced, for example, in a surface mounting type LD/PD module (The Technical Report of the Institute of Electronics Information and Communication Engineers of Japan, OPE94-39, published August, 1994, page 13), or in a passive alignment based on a marker when mounting a photodiode on a PLC platform (The Institute of Electronics Information and Communication Engineers, 1997 National Conference, C-3-56, page 241).

In embodiments shown in the foregoing examples (FIG. 7(e) FIG. 8(f), FIG. 9(k), FIG. 10(f), FIG. 11(c), FIG. 12(c)), FIG. 18, FIG. 19(a), FIG. 19(b), FIG. 20(a), FIG. 20(b), FIG. 21 and FIG. 22(a), drive circuit (driver) 829 of the laser diode and control circuit 830 (preamp and comparator) of the photodiode may be also provided. Furthermore, below-described switching element (12a) may be provided (see FIG. 23). In addition to switching element (12a), switch (130a) may be also provided (see FIG. 23).

In the examples in FIGS. 1 to 4(c), the switching element described below may be provided. In addition to switching element (12a), switch (130a) may be also provided (see FIG. 23).

Figure 28A:
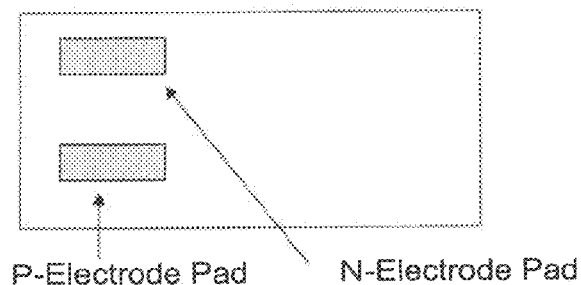
FIGS. 28(a) to 28(d) are top views each illustrating a surface of a laser diode or a photodiode.
Figure 28B:
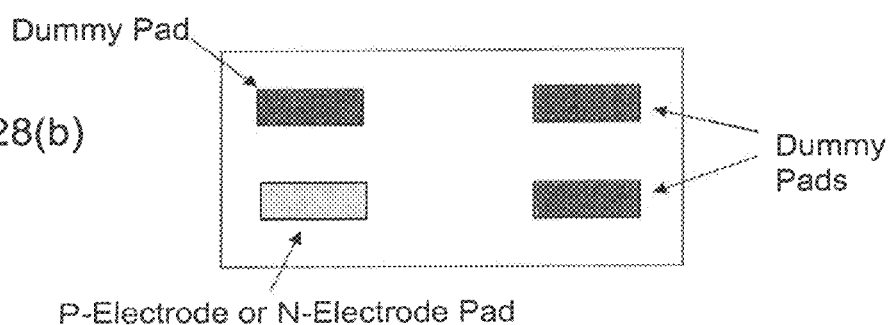
Figure 28C:
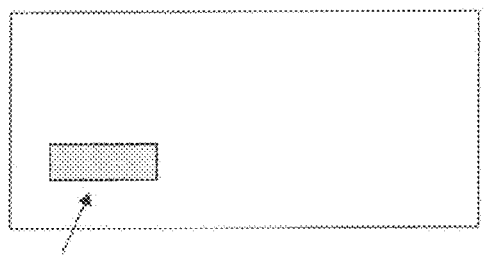
Figure 28D:
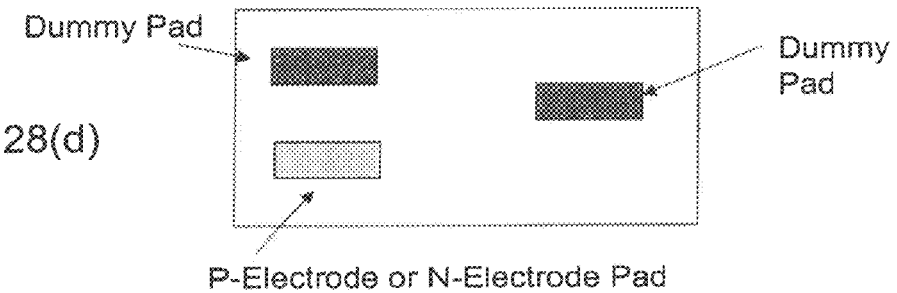

FIGS. 28(a), 28(b), 28(c) and 28(d) each illustrate a surface of a laser diode or a photodiode. In those illustrations, pads are shown. As shown in FIGS. 28(a) and 28(c), if one or two pads are formed, it is difficult to surface-mount an optical component. Therefore, as shown in FIGS. 28(b) and 28(d), other than a P-electrode and an N-electrode, it is preferred to form dummy pads. Dummy pads are preferably formed to make the total number of pads three or more. In FIGS. 1 through 4(d), FIG. 7(e), FIG. 8(f), FIG. 9(k), FIG. 10(f), FIG. 11(c), FIG. 12(c), FIG. 17(f), FIGS. 19(a)-19(b), FIGS. 20(a)-20(b), and FIG. 21, the laser diode and photodiode are preferably the type of laser diode and photodiode shown in FIGS. 28(b) and 28(d).

As shown in FIGS. 28(a) and 28(c), a P-electrode and an N-electrode on a laser diode or a photodiode may be formed on one surface (FIG. 28(a)) or may be formed on separate surfaces (FIG. 28(c)). Various connection methods between optical components and an optical waveguide are shown in FIG. 29.

Figure 29A:
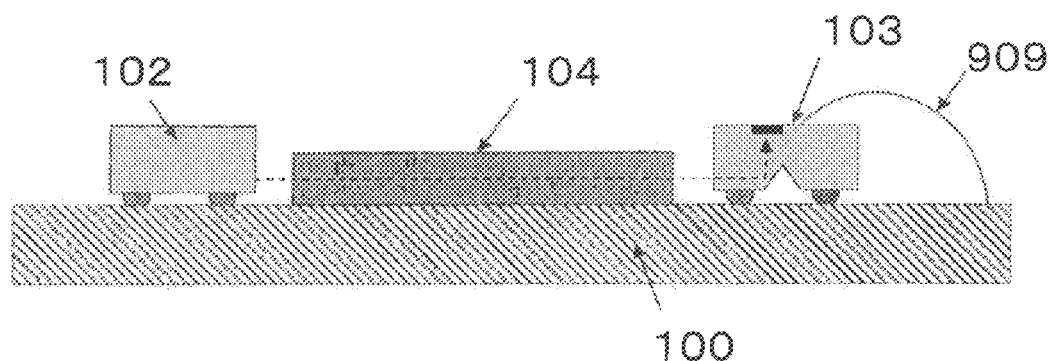
FIGS. 29(a) to 29(f) are side views illustrating exemplary connection methods between a light-emitting element and a light-receiving element.

FIG. 29(a) is a combination of an edge-emitting laser diode where a light-emitting spot (light-emitting portion) is near the bottom surface and a photodiode where a light-receiving portion (light-receiving region) is formed on the top surface (the surface opposite the one facing the flexible substrate). In the laser diode shown in FIG. 29(a), an epitaxial layer is formed on the InP substrate or GaAs substrate. The laser diode is flip-chip mounted in such a way that the surface where the epitaxial layer is formed faces the flexible substrate. The photodiode is a type of photodiode where a P-electrode is formed on the top surface and an N-electrode is formed on the bottom surface (the mounting surface, opposite the surface facing the substrate). As shown in FIG. 29(a), in the photodiode, a mirror is formed on the surface opposite the one where the light-receiving portion is formed. The light input through the edge is reflected by the mirror and reaches the light-receiving portion (P-electrode). Then, the light is transmitted to the electrical wiring of the flexible substrate through wire 909 on the pad connected to the P-electrode.

Figure 29B:
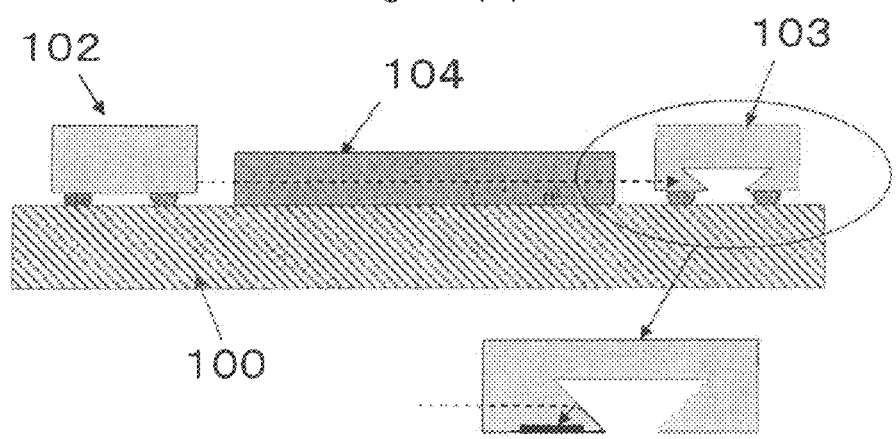

FIG. 29(b) is a combination of an edge-emitting type laser diode where a light-emitting spot (light-emitting portion) is near the bottom surface, and a photodiode where a light-receiving portion (light-receiving region, P-electrode) is formed on the bottom surface (the surface facing the flexible substrate). The laser diode shown in FIG. 29(b) is flip-chip mounted in such a way that the surface where an epitaxial layer is formed faces the flexible substrate. The photodiode shown in FIG. 29(b) is flip-chip mounted in such a way that the surface where an epitaxial layer is formed faces the flexible substrate. In the photodiode shown in the drawing, the light-receiving portion (light-receiving region, P-electrode), N-electrode and mirror are formed on the same surface. The light input through the edge of the photodiode is reflected by the mirror and reaches the light-receiving portion (P-electrode) formed on the bottom surface. Then, the light is transmitted via the pads and bumps to the electrical wiring of the flexible substrate.

Figure 29C:
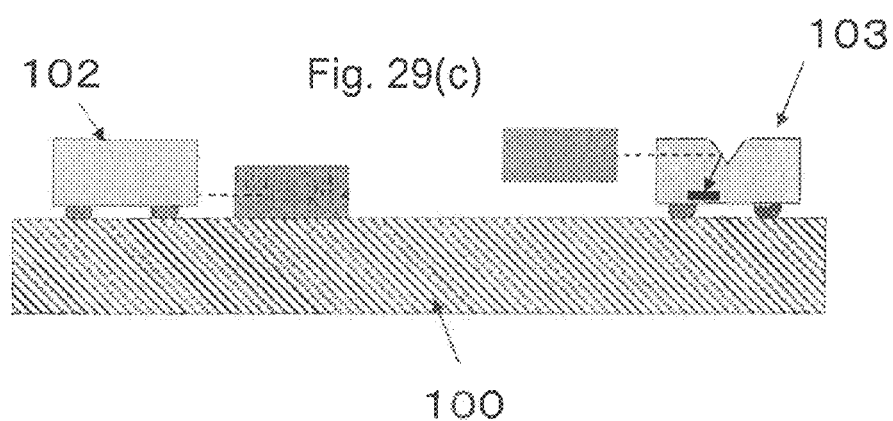

FIG. 29(c) is a combination of an edge-emitting type laser diode where the light-emitting spot (light-emitting portion) is near the bottom surface, and a photodiode where the light-receiving portion (light-receiving region, P-electrode) is formed on the bottom surface (the surface facing the flexible substrate). The laser diode shown in FIG. 29(c) is flip-chip mounted in such a way that the surface where an epitaxial layer is formed faces the flexible substrate. The photodiode shown in FIG. 29(c) is a type of photodiode where a P-electrode and an N-electrode are formed on the same surface. A mirror is formed on the surface opposite the surface where the P-electrode and N-electrode are formed. The photodiode is flip-chip mounted in such a way that the surface where the P-electrode and N-electrode are formed faces the flexible substrate. The P-electrode and N-electrode on the photodiode and the P-electrode and N-electrode on the laser diode are connected to the electrical wiring of the flexible substrate through solder bumps. In FIG. 29(c), the height of the light-emitting spot on the laser diode and the height of the mirror are different. Therefore, the input portion and output portion of the optical waveguide are positioned at different heights. The input portion is aligned with the height of the light-emitting portion in the laser diode and the output portion is aligned with the mirror position in the photodiode.

Figure 29D:
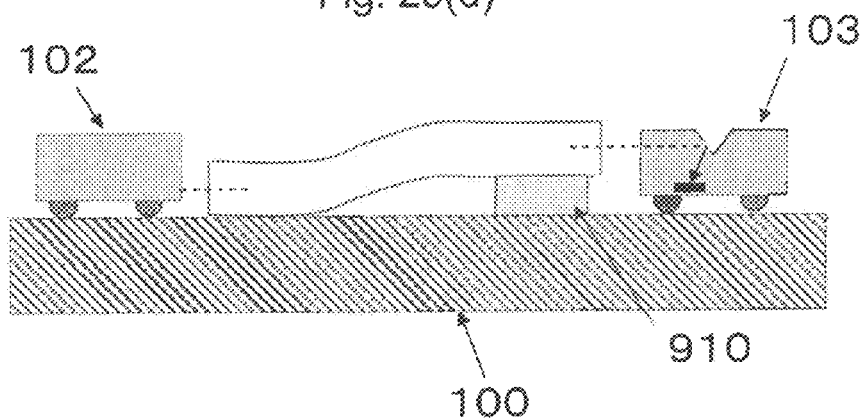
Figure 29E:
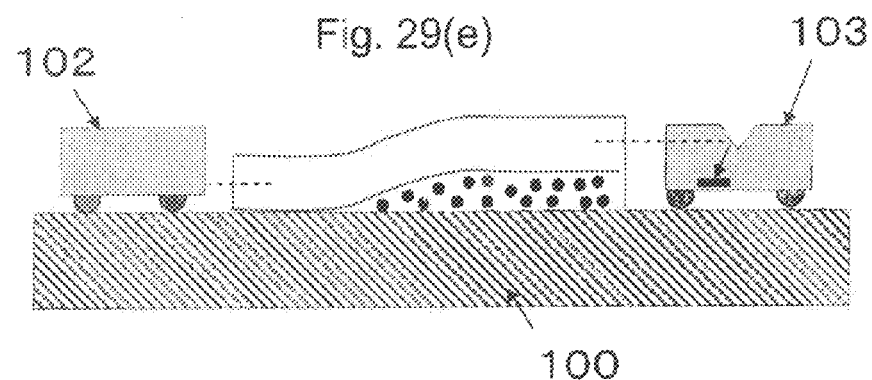
Figure 29F:
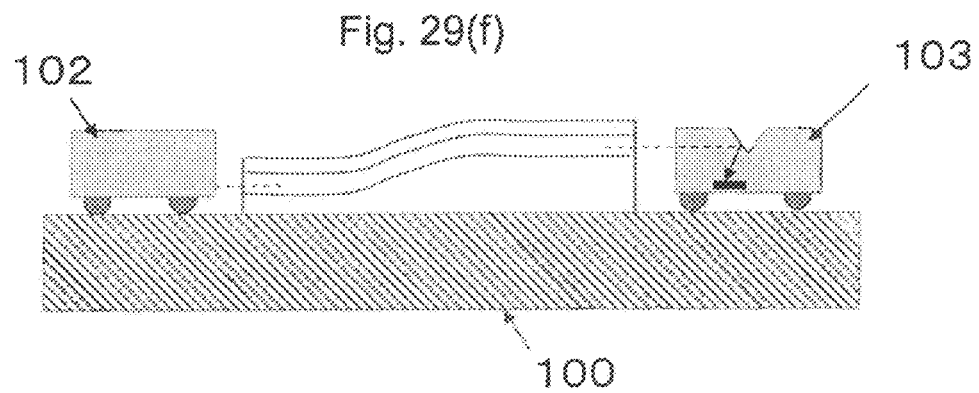

In the example shown in FIG. 29(d), to align the height of the core at the output side with the height of the mirror in the photodiode, at the output side of the optical waveguide a height-adjusting member is laid between the optical waveguide and the flexible substrate. In the example shown in FIG. 29(e), to align the height of the core at the output side with the height of the mirror in the photodiode, a height-adjusting bond is laid between the optical waveguide and the flexible substrate. In the example shown in FIG. 29(f), to align the height of the core at the output side with the height of the mirror in the photodiode, at the side facing the flexible substrate the clad layer thickness in the optical waveguide is adjusted.

Figure 30:
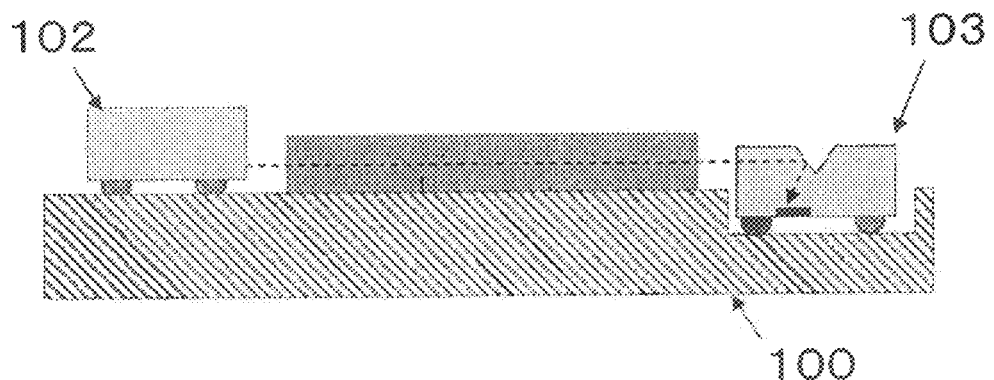
FIG. 30 is a side view illustrating another example of a connection method between a light-emitting element and a light-receiving element.

FIG. 30 is a combination of an edge-emitting type laser diode where the light-emitting spot (light-emitting portion) is near the bottom surface, and a photodiode where the light-receiving portion (the light-receiving region, P-electrode) is formed on the bottom surface (the surface facing the flexible substrate). The laser diode shown in FIG. 30 is flip-chip mounted in such a way that the surface where an epitaxial layer is formed faces the flexible substrate. The photodiode shown in FIG. 30 is a type of photodiode where a P-electrode (epitaxial layer) and an N-electrode are formed on the same surface. A mirror is formed on the surface opposite the surface where the P-electrode and N-electrode are formed. The photodiode is flip-chip mounted in such a way that the surface where the P-electrode and N-electrode are formed faces the flexible substrate. In FIG. 30, the photodiode is mounted in the cavity portion formed in the flexible substrate. The depth of the cavity portion is set so as to align the height of the core in the optical waveguide and the mirror position in the photodiode.

Figure 31:
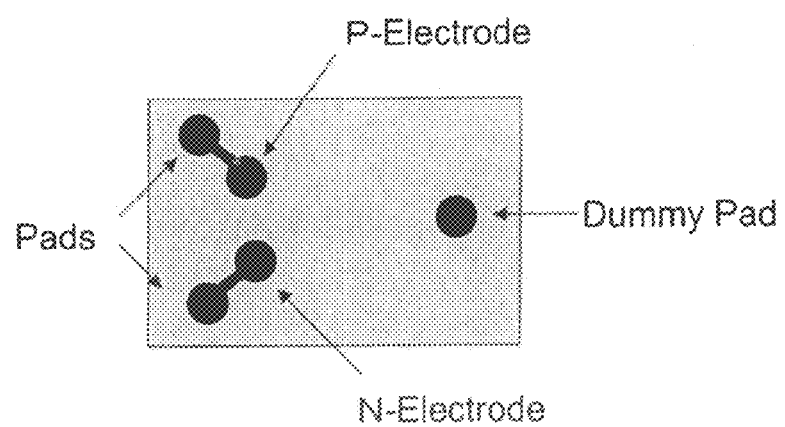
FIG. 31 is a top view illustrating pads on a light-emitting element or a light-receiving element.

FIG. 31 illustrates the P-electrode and N-electrode, the pad connecting to the P-electrode through the circuit, the pad connecting to the N-electrode through the circuit, and dummy pads. Bumps for the flip-chip mounting are formed on the P-electrode pad, N-electrode pad and dummy pads.

In FIGS. 1 through 4(d), FIG. 7(e), FIG. 8(f), FIG. 9(k), FIG. 10(f), FIG. 11(c), FIG. 12(c), FIG. 17(f), FIGS. 19(a)-19(b), FIGS. 20(a)-20(b), and FIG. 21, a photodiode, a laser diode and an optical waveguide to connect them may employ any one of the embodiments shown in FIGS. 29(a), 29(b), 29(c), 29(d), 29(e), 29(f) or FIG. 30. In the above description, electronic and optical components are flip-chip mounted via solder bumps; however, they may be flip-chip mounted via gold-stud bumps. For example, an optical waveguide may have a lower clad layer having a thickness of 25 µm, a core layer having a thickness of 50 µm, and an upper clad layer having a thickness of 25 µm. This optical waveguide may be adhered to a substrate via an adhesive layer having a thickness of 10 µm. Thus, the waveguide may have an optical axis located at about 60 µm from the surface of the substrate. A laser diode may have a light emitting point located at about 5 µm from a surface where its epitaxial structure is formed. In such an example, this laser diode may be mounted at about 55 µm from the surface of the substrate, using, for example, adhesive pads with 80 µm in diameter or solder balls with 90 µm in diameter. On the other hand, a photo diode may be mounted face up, having its epitaxial structure away from the surface of the substrate, and may have a light receiving point located at about 15 µm. In such an example, this photo diode may be mounted at 45 µm (60 µm-15 µm) from the surface of the substrate, using, for example, adhesive pads with 80 µm in diameter or solder balls with 80 µm in diameter. Table 2 below includes experimental results showing relationship between height of light emitting/receiving devices and diameters of adhesive pads and solder balls.

TABLE 2

|  | 65 um Ball | | 80 um Ball | | 90 um Ball | |
| --- | --- | --- | --- | --- | --- | --- |
| Pad Diameter (um) | 70 | 80 | 70 | 80 | 70 | 80 |
| Average Height (um) | 44.7 | 37.5 | 62 | 57.6 | 74.9 | 70.5 |
| Calculated Height (um) | 47 | 42 | 65 | 60 | 77 | 72 |
| N (number of samples) | 40 | 55 | 40 | 55 | 140 | 40 |
| Range +/− (max − min/2) | 8.5 | 9.5 | 7 | 7.5 | 7.5 | 10 |
| Δ (Calculated − Average) | 2.3 | 4.5 | 3 | 2.4 | 2.1 | 1.5 |

In FIGS. 1 through 4(d), FIG. 7(e), FIG. 8(f), FIG. 9(k), FIG. 10(f), FIG. 11(c), FIG. 12(c), FIG. 17(f), FIGS. 19(a)-19(b), FIGS. 20(a)-20(b), and FIG. 21, the laser diode may be a transverse multimode excitation type, and the optical waveguide may be a multimode transmission type.

Figure 32:
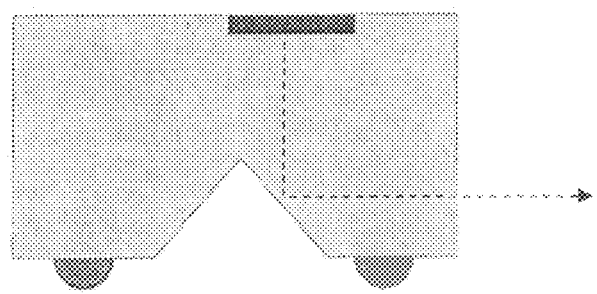
FIG. 32 is a side view illustrating an example of a laser diode.

In FIGS. 1 through 4(d), FIG. 7(e), FIG. 8(f), FIG. 9(k), FIG. 10(f), FIG. 11(c), FIG. 12(c), FIG. 17(f), FIGS. 19(a)-19(b), FIGS. 20(a)-20(b), and FIG. 21, the laser diode may be the type of optical component shown in FIG. 32. The laser diode converts the light output from the light-emitting region approximately 90 degrees at the mirror (reflecting surface) formed at the substrate, and emits light from an edge of the laser diode.

The dotted lines shown in FIGS. 29(a), 29(b), 29(c), 29(d), 29(e), 29(f), FIG. 30 and FIG. 32 indicate light paths.

Figure 33:
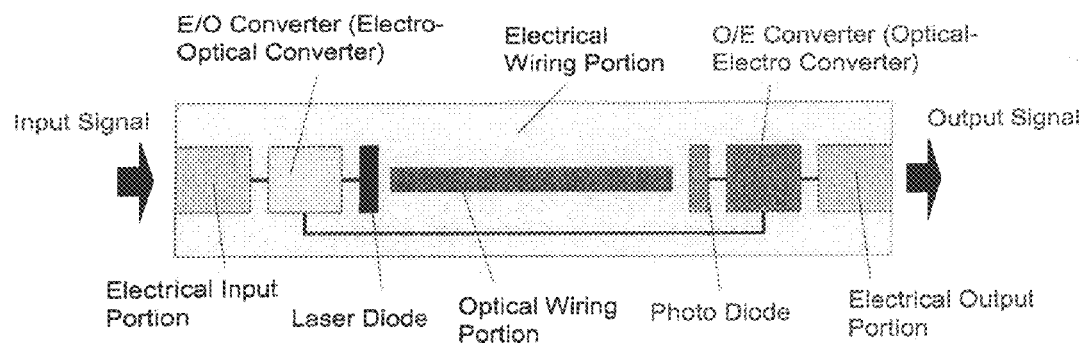
FIG. 33 is illustrates an example of an optical interconnect of the present invention.
Figure 34:
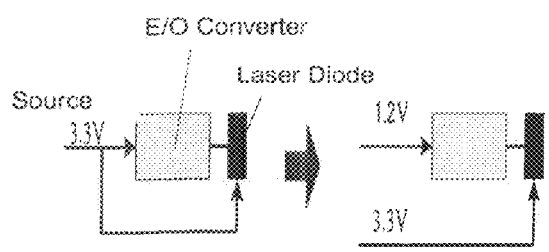
FIG. 34 is a schematic view illustrating an exemplary structure for reducing electric consumption according to an embodiment of the present invention.
Figure 35:
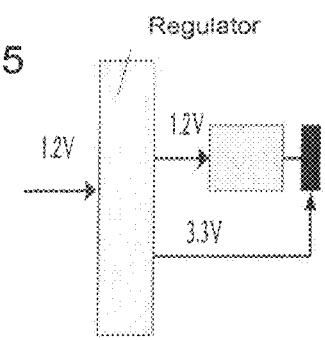
FIG. 35 is a schematic view illustrating a structure for a electric source and voltage according to an embodiment of the present invention.
Figure 36:
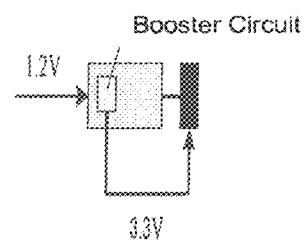
FIG. 36 is an electrical-optical circuit having a booster circuit according to an embodiment of the present invention.

FIG. 33 illustrates another example of an optical interconnect of the present invention. Optical interconnect for use in mobile equipment is required to substantially suppress the amount of electricity consumed. To reduce power consumption, it is effective to use low voltage to drive active elements such as electro-optical converter circuit, light-emitting element, optical-electrical converter circuit, and light-receiving element. An electro-optical converter circuit and an opto-electrical converter circuit may be driven at approximately 1.2V. However, light-emitting and light-receiving elements require a bias voltage at least approximately 2V or larger to operate normally. Usually, an electro-optical converter circuit, and an optical-electrical converter circuit, or all active elements use a 3.3 V single power supply. To reduce power consumption, a reduction in power supply voltage has been attempted. The minimum load voltage required for light-emitting and light-receiving elements is about 2.2V. FIG. 34 is an exemplary structure for reducing power consumption in the present invention. A minimum power-source voltage is supplied separately to an electro-optical converter circuit and a light-emitting element (opto-electrical converter circuit and light-receiving element). For example, to an electro-optical converter circuit, 1.2V is supplied, and to a light-emitting element, 3.3V is supplied. Therefore, power consumption, which is the product of electric current multiplied by voltage, may be substantially reduced. FIG. 35 illustrates an example of a method for supplying different power-source voltages. An independent regulator is placed outside the electro-optical (opto-electrical) converter circuit to supply multiple power-source voltages. A regulator may be placed outside the interconnect, and multiple power-source voltages may be supplied through a power input portion. In FIG. 36, a voltage converter (booster circuit) is placed inside the electro-optical (opto-electrical) converter circuit. A low voltage, for example 1.2V, is supplied to an electro-optical (opto-electrical) converter circuit to drive the circuit; at the same time, the voltage boosted to 3.3V at the booster circuit inside the electro-optical (opto-electrical) converter circuit is supplied to the light-emitting element. The electro-optical converter circuit converts electrical signals to optical signals. The optical-electrical converter circuit converts optical signals to electrical signals.

Figure 37:
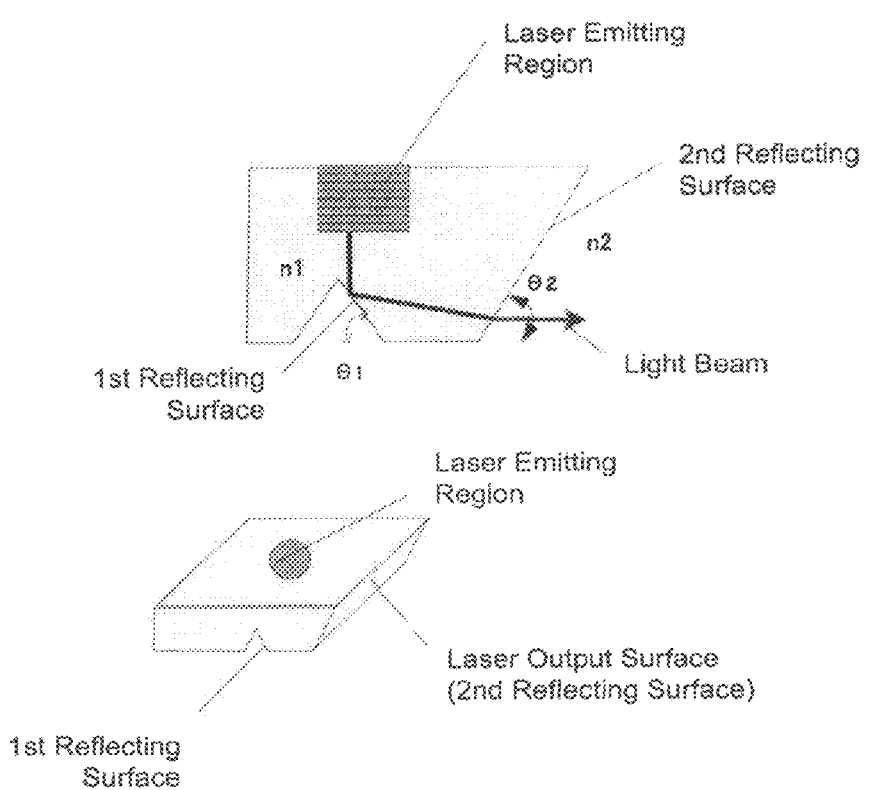
FIG. 37 includes side and schematic views illustrating a surface light emitting element according to an embodiment of the present invention.

FIG. 37 shows schematic views illustrating a surface light emitting element which has a reflecting surface in its inside and functions as an edge-type light emitting element. First reflecting surface at the bottom portion can be formed by anisotropic wet etching. For reflecting surface with about a 55° angle, a reflecting light is directed to a side surface of light emitting element with an angle of about 20° with respect to a horizontal surface. For perpendicular side surface, element with refraction index of about 3.6 causes total reflection at side surface and reflecting light does not transmit to the outside of element. To transmit radiating light to the outside of the element, side surface should be a slanted surface (second reflecting surface). To obtain an emitted light which is parallel to horizontal surface, an angle of a slanted surface $\theta 2$ should approximately satisfy a relationship, $n1 \cos(2(\theta 1-45)+\theta 2) = n2 \cos \theta 2$, where a refraction index of element is $n1$, an angle of first reflecting surface is $\theta 1$ and refraction index of medium surrounding element is $n2$. For air being medium surrounding element, $\theta 2$ is about 63°, and for resin with refractive index of 1.4 being medium surrounding element, $\theta 2$ is about 58°.

Switching Element (Switching Circuit)

Figure 23:
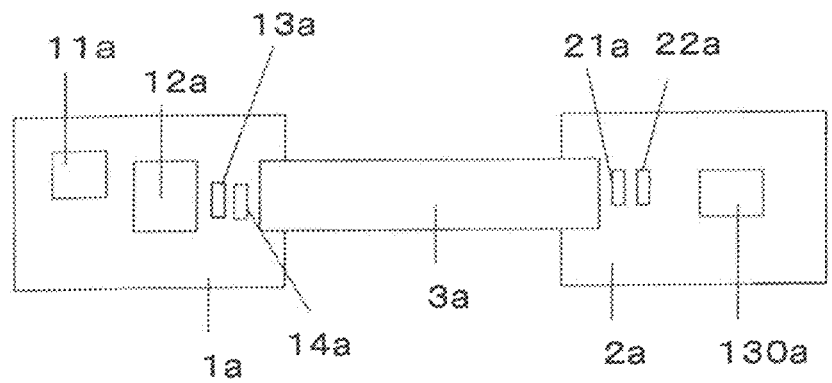
FIG. 23 is a top view illustrating an opto-electrical transmitting device according to an embodiment of the present invention.

FIG. 23 is a top view illustrating an opto-electrical transmitting device according to one embodiment of the present invention. The opto-electrical transmitting device according to this embodiment is structured with first substrate (1a), second substrate (2a) and transmission substrate (3a), which transmits signals between first substrate (1a) and second substrate (2a). On first substrate (1a), components such as logic (11a), switching element (12a), driver (13a), laser diode (14a) are mounted. On second substrate (2a), components such as photodiode (21a), amplifier (22a), switch (130a) are mounted. On transmission substrate (3a), an electrical circuit and an optical waveguide are formed to transmit signals between first substrate (1a) and second substrate (2a).

The laser diode is preferably an edge-emitting type, and the photodiode is preferably an edge-receiving type. Also, the laser diode is preferably single mode, and the optical waveguide is preferably multimode.

Figure 24:
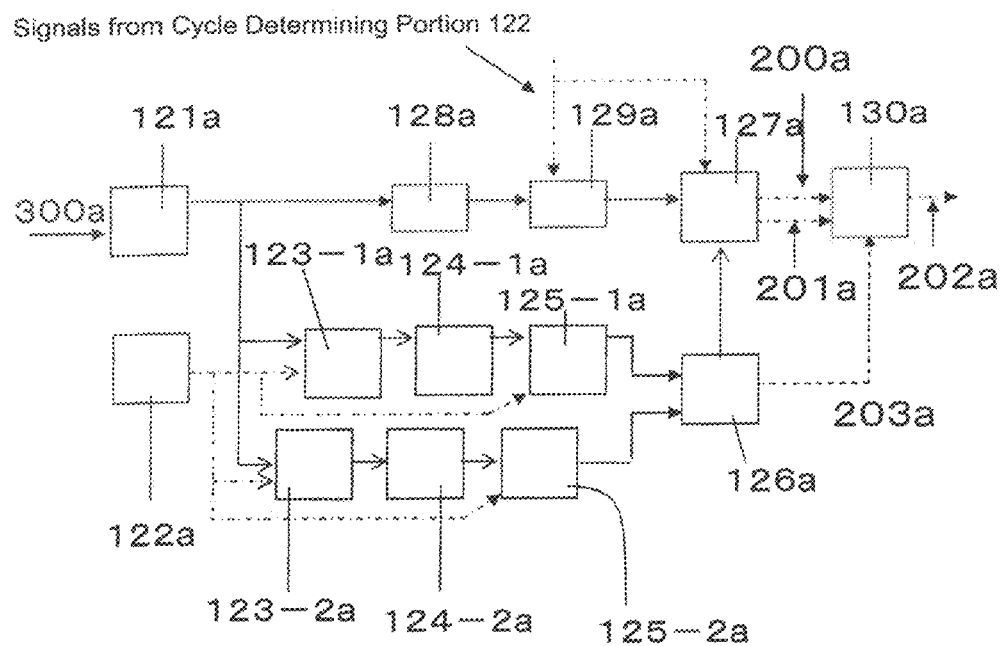
FIG. 24 is a schematic diagram illustrating a switching element according to an embodiment of the present invention.
Figure 25:
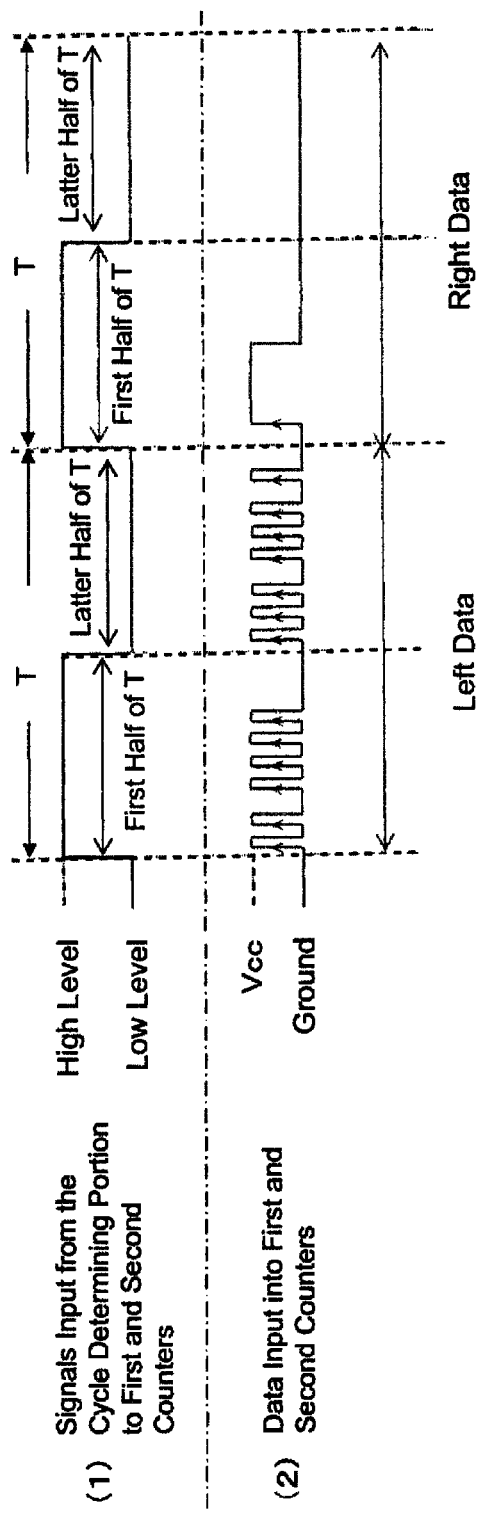
FIG. 25 is a diagram illustrating exemplary results counted at a switching element according to an embodiment of the present invention.

Switching element (12a) is a component which determines means to be used when transmitting signals from first substrate (1a) to second substrate (2a) (either optical or electrical means). As illustrated in FIG. 24, switching element (12a) is structured with level converter (121a), cycle determining element (122a), first counter (123-1a), second counter (123-2a), first comparator (124-1a), second comparator (124-2a), first retaining circuit (125-1a), second retain circuit (125-2a), accumulator (126a), selector (127a), delay line (128a) and buffer (129a). The role of each of the components is described with reference to FIGS. 24 and 25. FIG. 25 illustrates information regarding two cycles of data to be counted after being input to the switching element. The level converter converts data which are input to the input element so that the data can be processed at the switching element. Depending on data or other factors, Vcc and ground levels of input data (300a) may not be constant before being processed at the switching element. Level converter (121a) has the function of converting Vcc and ground of input data (300a) to a predetermined Vcc-constant and ground-constant. For example, input data having 3.3V at Vcc and 0.8V at ground are converted by the level converter to data having 2.2V at Vcc and 0.2V at ground. Input data having 1.8V at Vcc and 1.2V at ground are also converted by the level converter to data having 2.2V at Vcc and 0.2V at ground. Data having different voltages are also converted by the level converter to data having 2.2V at Vcc and 0.2V at ground. The values, 2.2V at Vcc-constant and 0.2V at ground-constant, are example voltages. As described above, since the level converter converts input signals (300a) so that the data can be processed at the switching element, the level converter is not necessary if input data (300a) are ready to be processed at the switching element. The data converted by the level converter are transmitted to selector (127a) through delay line (128a) and buffer (129a). The data is retained at buffer (129a) and then output cycle by cycle to the selector according to the signal (a clock signal) input from cycle determining element (122a). The data, which are processed at the level converter, are transmitted to selector (127a). At the same time, the data are transmitted to first counter (123-1a) and second counter (123-2a) to obtain information about whether the data are a fast signal or a slow signal. When the data reach the counters, the number transmitted from ground to Vcc is counted. To determine if the transmitted data are a fast signal or a slow signal, the time as well as the information regarding the number is used. Therefore, information regarding cycle (T) is input from cycle determining element (122a) to first counter (123-1a) and second counter (123-2a) (see (1) in FIG. 25). Based on cycle (T), first counter (123-1a) and second counter (123-2a) count the number which is transmitted from ground to Vcc (a transmission number) within a predetermined time (the number may also be counted when transmitted from Vcc to ground). For example, the first counter counts the number when the data received from the cycle determining element are at the high level (Vcc). The second counter counts the number when the data received from the cycle determining element are at the low level (ground). As illustrated in (2) of FIG. 25, the same data are transmitted to the first counter and the second counter continuously. A transmission number of data input in a sequence is counted continuously by a cycle (T) using the first counter and second counter. The first counter counts the number transmitted during the first half of the cycle (T) and the second counter counts the number transmitted during the latter half. In the illustration, two cycles of waveforms are illustrated as an example (with reference to (2)of FIG. 25, the data on the left cycle (T) are referred to as left data and the data on the right cycle (T) are referred to as right data). However, in actuality, continuous data are input to the counters. The transmission number of the left data is six (6) during the first half of the cycle (T) and seven (7) during the latter half and the transmission number of the right data is one (1) during the first half of the cycle (T) and zero (0) during the latter half. Left data and right data are continuous, but are one cycle off from each other. The first counter may count the number at the low level and the second counter may count the number at the high level. The cycle (T) may be either fixed or variable, but variable cycles are preferred. At the first counter, the information regarding the number counted at the high level during one cycle (the final information on the number of the left data: six (6); the final information on the number of the right data: one (1)) is transmitted to first comparator (124-1a). At the first comparator, the number information received from the first counter is compared with the number retained at the first comparator (for example, five (5)). Then, when the received information on the number is the same as or greater than the number retained at the first comparator, a signal is output from first comparator (124-1a) to first retaining circuit (125-1a) to accumulator (126a) that the data whose transmission number is counted at the first counter are fast signals. The determined result is retained for one cycle at first retaining circuit (125-1a) and accumulator (126a). The same are conducted at second counter (123-2a), second comparator (124-2a), second retaining circuit (125-2a) and accumulator (126a). Namely, at the second counter, information regarding the number counted at the low level during one cycle (the final information on the number of the left data: seven (7); the final information on the number of the right data: zero (0)) is transmitted to second comparator (124-2a). At the second comparator, the information on the number received from the second counter is compared with the number retained at the second comparator (for example, five (5)). Then, when the received information on the number is the same as or greater than the number retained at the second comparator, a signal is output from second comparator (124-2a) to second retaining circuit (125-2a) to accumulator (126a) that the data whose transmission number is counted at the second counter are fast signals. The determined result is retained for one cycle at second retaining circuit (125-2a) and accumulator (126a). In the above, examples are described when the result is determined to be fast. The following describes examples when the result is determined to be slow. After the counting is finished (after the first half of a cycle is finished at the first counter and after one cycle is finished at the second counter), the first counter and second counter are reset (the transmission number becomes zero (0)). The data retained at the first retaining circuit, second retaining circuit and accumulator (one (1) if fast, or zero (0) if slow) are reset by the cycle to be zero (0). Then, if the transmission number counted at the first counter does not reach the number information retained at the first comparator during one cycle (the first half of the cycle (T)), the first determined result retained at the first retaining circuit and accumulator is slow (zero (0)). The second result is determined the same way. If the transmission number counted at the second counter does not reach the number information retained at the second comparator during one cycle (the latter half of the cycle (T)), the second determined result retained at the second retaining circuit and accumulator is slow (zero (0)). Based on a determined result input through the first retaining circuit to the accumulator (the first determined result) and another determined result input through the second retaining circuit to the accumulator (the second determined result), the accumulator generates an accumulated determined result. The accumulated determined result is determined to be fast if at least either the first determined result or the second determined result is fast (one (1)). Buffer (129a) outputs the data to selector (127a) based on the clock signal from cycle determining element (122a). Selector (127a) picks up the accumulated determined result generated at the accumulator based on the clock signal from cycle determining element (122a). Then, based on the accumulated determined result, the data which reach selector (127a) from buffer (129a) is output either to the optical circuit or to the electrical circuit on the transmission substrate. At that time, the data determined to be a fast signal at the accumulator is output to the optical circuit on the transmission substrate via the driver and the laser diode, and the data determined to be a slow signal is output to the electrical circuit. When transmitting electrically, it is preferred to switch off the driver IC, laser diode, photodiode and amplifier to turn off the optical transmission circuit. Also, the accumulator outputs the accumulated determined result to switch (130a) (signal (203a)). The data transmitted to the second substrate via the optical waveguide on the transmission substrate reach switch (130a) via photodiode (21a) and amplifier (22a) ((200a) in FIG. 24, route (200a)). Data transmitted to the second substrate via the electrical circuit on the transmission substrate also reach switch (130a) ((201a) in FIG. 24, route (201a)). Based on signal (203a) (may also be referred to as an "identification signal") from the accumulator, switch (130a) recognizes which of route (200a) or route (201a) is to be used to transmit the data to the switch. Then, according to the recognition, the switch connects the routes, either route (200a) and route (202a) or route (201a) and route (202a), and outputs the data to single route (202a) formed on the second substrate.

In the above description, one cycle is used to determine the data speed, but a half cycle may also be used to determine the data speed. That is, a circuit may be set for buffer (129a) and selector (127a) to be driven by the half cycle based on a clock signal from cycle determining element (122a). The selector picks up the determined result at the accumulator every half cycle (the accumulator does not generate the accumulated determined result by adding the first determined result and second determined result. Based on each of the first determined result and the second determined result, the selector outputs data every half cycle.)

The above description is about a transmission method from the first substrate to the second substrate. Components such as logic and switching element may also be mounted on the second substrate.

The transmission from the second substrate to the first substrate may also be conducted through either optical or electrical circuit, selected by using the switching element according to the transmission data.

The transmission from the second substrate to the first substrate may be conducted through the electrical circuit only.

Figure 26:
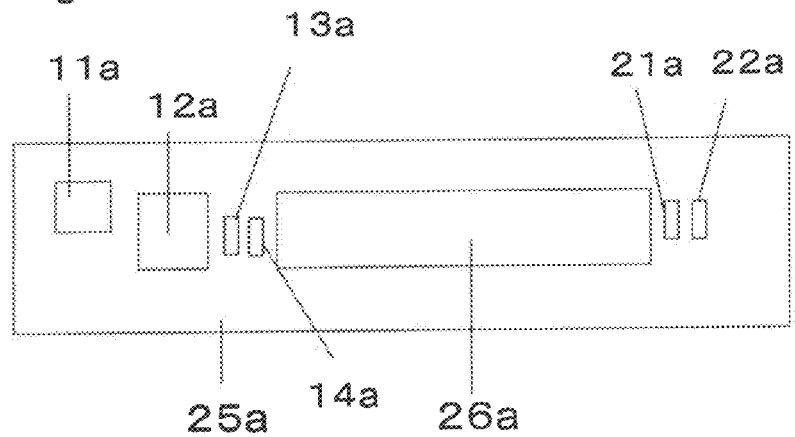
FIG. 26 is a top view illustrating an opto-electrical transmitting device according to another embodiment of the present invention.

FIG. 26 illustrates an optical-electrical transmitting device according to another embodiment of the present invention. In this embodiment, logic (11a), switching element (12a), driver (13a), laser diode (14a), photodiode (21a), amplifier (22a) and optical waveguide (26a) are mounted on one flexible substrate (25a).

Figure 27:
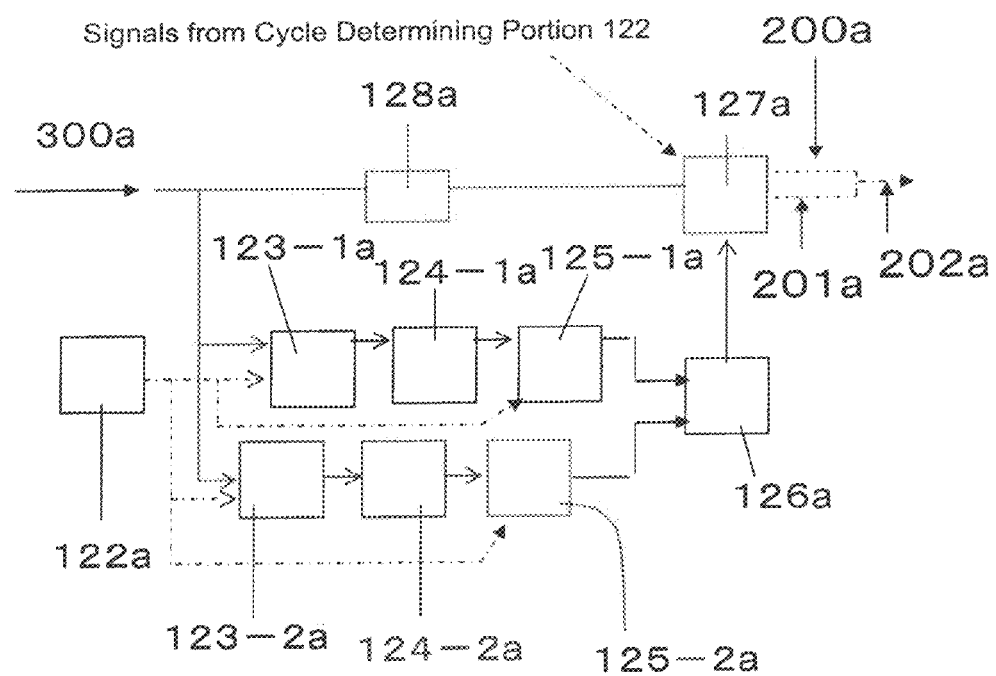
FIG. 27 schematic diagram illustrating a switching element according to another embodiment of the present invention.

By sandwiching the optical waveguide, first region where components such as logic (11a), switching element (12a), driver (13a) and laser diode (14a) are mounted, and second region where components such as photodiode (21a) and amplifier (22a) are mounted, are arranged. Data transmission between the first region and the second region is conducted by using optical waveguide (26a) or an electrical circuit connecting the first region and the second region. As in the previous embodiment above, the optical waveguide may be formed on flexible substrate (25a) (equivalent of transmission substrate (3a) in the previous embodiment), or may also be formed on another flexible substrate, which is then laminated on flexible substrate (25a). A schematic diagram illustrating a circuit including a switching element of this embodiment is shown in FIG. 27. In this embodiment, since input data (300a) can be processed at the switching element, level converter (121a) in the previous embodiment is not provided. In addition, data (200a, 201a) which are output from selector (127a) are connected to route (202a) without passing through switch (130a). Also, buffer (129a) is not provided.

To determine the data speed, processing (processing time) is carried out at the counter, comparator, retaining circuit and accumulator. Therefore, in this embodiment, where a buffer is not provided, input data (300a) reach the selector before the accumulated determined result is generated. Thus, in this embodiment, where a buffer is not provided, data are output from the selector to the optical circuit or electrical circuit by using the result determined at one cycle prior to the current cycle. With reference to FIG. 25, left data are output from the selector by using the result determined at right data (the data which were transmitted one cycle prior to left data). Since signals usually keep their speeds, either fast or slow, for a while, even if data were transmitted from the selector to the transmission substrate through a wrong route, it would be only for the first cycle or so when the data speed was changed from fast to slow or slow to fast.

In this embodiment, level converter (121a), buffer (129a) and switch (130a) may be provided as in the previous embodiment.

The buffer may be built into the selector circuit.

Either buffer (130a) or delay line (129a) may be provided. Data may be transmitted directly to selector (127a) without passing through buffer (130a) and delay line (129a).

Referring to FIGS. 23 and 26, logic (11a) is mounted on the substrate, but logic (11a) may be excluded.

Optical-electrical transmitting devices according to the embodiments of the present invention is suitably used on mobile equipment. It is preferable to use the first substrate (first region) as a body (where the keyboard is provided) and to use the second substrate (second region) as an image display.

The switching element may be built into the driver.

To switch between the optical transmission circuit and electrical transmission circuit, on/off signals on mobile equipment (for example, on/off signals for a sleep mode) may be used.

These foregoing embodiments according to the present invention relates to optical interconnect devices having an integrated structure of electrical and optical circuits and to methods for manufacturing optical interconnect devices, including but not limited to, a method for forming an optical waveguide according to an alignment mark formed on an optical component, or forming mounting pads for optical components based on alignment marks formed on an optical waveguide.

Obviously, numerous modifications and variations of the present invention are possible in light of the above teachings. It is therefore to be understood that within the scope of the appended claims, the invention may be practiced otherwise than as specifically described herein.

The invention claimed is

1. An optical interconnect device comprising:
a first rigid substrate including an electrical wiring circuit, a drive circuit connected to the electrical wiring circuit, and a laser diode which is connected to the drive circuit and configured to emit a light;
a second rigid substrate including an electrical wiring circuit and a photodiode connected to the electrical wiring circuit;
an electrical wiring connection which electrically connects the electrical wiring circuit of the first rigid substrate to the electrical wiring circuit of the second rigid substrate; and
an optical waveguide which optically connects the laser diode of the first rigid substrate to the photodiode of the second rigid substrate.

2. The optical interconnect device according to claim 1, further comprising:
a first flexible electrical substrate electrically connected to the first rigid substrate;
a second flexible electrical substrate electrically connected to the second rigid substrate; and
two detachable electrical connector terminals connected to a respective end of each of the two flexible electrical substrates.

3. The optical interconnect device according to claim 1, wherein:
the first rigid substrate comprises a first rigid-flexible substrate,
the second rigid substrate comprises a second rigid-flexible substrate, and
the first rigid-flexible substrate, the second rigid-flexible substrate and the electrical wiring are integrally formed.

4. The optical interconnect device according to claim 1, further comprising a booster device configured to generate a voltage to be supplied to at least one of the laser diode and the photodiode.

5. The optical interconnect device according to claim 1, further comprising
a flexible substrate supporting the optical waveguide and the electrical wiring connection.

6. The optical interconnect device according to claim 5, further comprising reinforcing layers attached to the flexible substrate.

7. The optical interconnect device according to claim 1, wherein:
the laser diode comprises an edge-emitting type laser diode having an epitaxial surface facing down toward the first rigid substrate, and
the photodiode comprises an edge-receiving type photodiode having an epitaxial surface facing down toward the second rigid substrate.

8. The optical interconnect device according to claim 1, wherein:
the laser diode comprises an edge-emitting type laser diode having an epitaxial surface facing down toward the first rigid substrate,
the photodiode comprises an edge-receiving type photodiode having a reflecting surface facing up away from the second rigid substrate and an epitaxial surface facing down toward the second rigid substrate, and the reflecting surface of the photodiode is positioned to reflect the optical signal from the laser diode toward the epitaxial surface of the photodiode.

9. The optical interconnect device according to claim 1, wherein:
the optical waveguide has a first edge portion facing the laser diode and a second edge portion facing the photodiode, the optical waveguide is positioned such that the second edge portion is located higher than the first edge portion with respect to the first rigid substrate and second rigid substrate, and the laser diode and the photodiode are positioned such that optical axes of the laser diode and the photodiode have a difference in height which matches a difference in height of the first and second edge portions of the optical waveguide.

10. The optical interconnect device according to claim 1, wherein the optical waveguide has an edge portion which faces the laser diode and has a larger cross-sectional area than cross-sectional areas of other portions of the optical waveguide.

11. The optical interconnect device according to claim 1, further comprising a regulator configured to supply a voltage to each one of the drive circuit and the photodiode such that the voltage supplied to the drive circuit is smaller than the voltage supplied to the photodiode.

12. The optical interconnect device according to claim 1, wherein:

the laser diode comprises an edge-emitting type laser diode having an epitaxial surface facing down toward the first rigid substrate, and the photodiode comprises an edge-receiving type photodiode having an epitaxial surface facing up away from the second rigid substrate.

13. The optical interconnect device of claim 1, wherein:

the electrical wiring connection provides a ground and power connection between the first and second rigid substrates, and the optical waveguide provides a signal connection between the first and second rigid substrates.

14. The optical interconnect device of claim 1, wherein the optical waveguide provides a signal connection for a signal of at least 1 Gb/s between the first and second rigid substrates.

15. An optical interconnect device comprising:

a flexible electrical substrate including a first electrical wiring portion and a second electrical wiring portion; wherein the first electrical wiring portion involves an electrical wiring circuit, a drive circuit connected to the electrical wiring circuit of the first electrical wiring portion, and a laser diode which is connected to the drive circuit and is configured to emit a light, and the second electrical wiring portion includes an electrical wiring circuit and a photodiode connected to the electrical wiring circuit of the second electrical wiring portion;

an electrical wiring electrically connecting the electrical wiring circuit of the first electrical wiring portion and the electrical wiring circuit of the second electrical wiring portion; and an optical waveguide optically connecting the laser diode of the first electrical wiring portion and the photodiode of the second electrical wiring portion.

16. The optical interconnect device according to claim 15, further comprising a booster configured to generate a voltage to be supplied to at least one of the laser diode and the photodiode.

17. The optical interconnect device according to claim 15, wherein:

the laser diode comprises an edge-emitting type laser diode having an epitaxial surface facing down toward the first electrical wiring portion, and the photodiode comprises an edge-receiving type photodiode having an epitaxial surface facing up away from the second electrical wiring portion.

18. The optical interconnect device according to claim 15, wherein:

the laser diode comprises an edge-emitting type laser diode having an epitaxial surface facing down toward the first electrical wiring portion, and the photodiode comprises an edge-receiving type photodiode having an epitaxial surface facing down toward from the second electrical wiring portion.

19. The optical interconnect device according to claim 15, wherein:

the laser diode comprises an edge-emitting type laser diode having an epitaxial surface facing down toward the first electrical wiring portion, the photodiode comprises an edge-receiving type photodiode having a reflecting surface facing up away from the second electrical wiring portion and an epitaxial surface facing down toward the second electrical wiring portion, and the reflecting surface of the photodiode is positioned to reflect the optical signal from the laser diode toward the epitaxial surface of the photodiode.

20. The optical interconnect device according to claim 15, wherein:

the optical waveguide has a first edge portion facing the laser diode and a second edge portion facing the photodiode, the optical waveguide is positioned such that the second edge portion is located higher than the first edge portion with respect to the first electrical wiring portion and second electrical wiring portion, and the laser diode and the photodiode are positioned such that optical axes of the laser diode and the photodiode have a difference in height which matches a difference in height of the first and second edge portions of the optical waveguide.

21. The optical interconnect device according to claim 15, wherein the optical waveguide has an edge portion which faces the laser diode and which has a larger cross-sectional area than cross-sectional areas of other portions of the optical waveguide.

22. The optical interconnect device according to claim 15, further comprising a regulator configured to supply voltages to each of the drive circuit and the photodiode such that the voltage supplied to the drive circuit is smaller than the voltage supplied to the photodiode.

23. The optical interconnect device according to claim 15, wherein the flexible electrical substrate supports the optical waveguide and the electrical wiring.

24. The optical interconnect device according to claim 23, wherein the optical waveguide is adhered to the flexible electrical substrate through an adhesive layer.

25. The optical interconnect device according to claim 23, further comprising reinforcing layers attached to the flexible electrical substrate.

26. The optical interconnect device of claim 15, wherein:

the electrical wiring connection provides a ground and power connection between the first and second electrical wiring portions, and the optical waveguide provides a signal connection between the first and second electrical wiring portions.

27. The optical interconnect device of claim 15, wherein the optical waveguide provides a signal connection for a signal of at least 1 Gb/s between the first and second electrical wiring potions.

* * * * *